(12) United States Patent
Isobe

(10) Patent No.: US 12,009,808 B2
(45) Date of Patent: Jun. 11, 2024

(54) SEMICONDUCTOR DEVICE

(71) Applicant: FUJI ELECTRIC CO., LTD., Kawasaki (JP)

(72) Inventor: Daisuke Isobe, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 256 days.

(21) Appl. No.: 17/704,236

(22) Filed: Mar. 25, 2022

(65) Prior Publication Data

US 2022/0216863 A1    Jul. 7, 2022

Related U.S. Application Data

(63) Continuation of application No. PCT/JP2021/002585, filed on Jan. 26, 2021.

(30) Foreign Application Priority Data

| Mar. 31, 2020 | (JP) | 2020-063843 |
| Jun. 1, 2020 | (JP) | 2020-095640 |

(51) Int. Cl.
   *H03K 17/082*   (2006.01)
   *H02H 3/093*    (2006.01)
   *H03K 17/284*   (2006.01)

(52) U.S. Cl.
   CPC ......... *H03K 17/0822* (2013.01); *H02H 3/093* (2013.01); *H03K 17/284* (2013.01)

(58) Field of Classification Search
   CPC ................ H02H 3/08; H02H 3/093; H03K 17/082–0828
   See application file for complete search history.

(56) References Cited

U.S. PATENT DOCUMENTS

| 5,710,508 A * | 1/1998 | Watanabe ......... H03K 17/0828 |
| | | 323/284 |
| 2006/0023383 A1* | 2/2006 | Thiery .................. H02H 3/093 |
| | | 361/100 |

(Continued)

FOREIGN PATENT DOCUMENTS

| JP | H08-88548 A | 4/1996 |
| JP | 2009-212704 A | 9/2009 |

(Continued)

OTHER PUBLICATIONS

International Search Report for PCT/JP2021/002585, dated Apr. 13, 2021.

(Continued)

*Primary Examiner* — Jared Fureman
*Assistant Examiner* — Christopher J Clark
(74) *Attorney, Agent, or Firm* — Rabin & Berdo, P.C.

(57) ABSTRACT

Upon an input of an input signal that instructs to turn on a power semiconductor element, a pulse generation circuit generates a pulse. Upon reception of the pulse, a gated latch circuit holds an overcurrent detection state of an overcurrent detection circuit. In response to the input of the input signal and an overcurrent situation having been detected, an overcurrent mode switching circuit outputs an inverted or non-inverted oscillation signal, which is obtained by inverting or not inverting an oscillation signal generated by an oscillation signal generation circuit depending on the overcurrent situation being detected before or after the input of the input signal, and also outputs an inverted oscillation signal obtained by inverting the oscillation signal. A timing determination circuit periodically turns on the power semiconductor element based on the inverted oscillation signal and frequency divided signals obtained by frequency dividing the inverted or non-inverted oscillation signal.

11 Claims, 15 Drawing Sheets

(56) References Cited

U.S. PATENT DOCUMENTS

2009/0219661 A1   9/2009   Mitsuda
2019/0123541 A1   4/2019   Takuma et al.

FOREIGN PATENT DOCUMENTS

JP    2015-046954 A    3/2015
WO    2017/187785 A1   11/2017

OTHER PUBLICATIONS

Sho Nakagawa, et al., "One-Chip Linear Control IPS, F5106H", Fuji Electric Journal, vol. 86, No. 4, Dec. 30, 2013.
Written Opinion for PCT/JP2021/002585, dated Apr. 13, 2021.

* cited by examiner

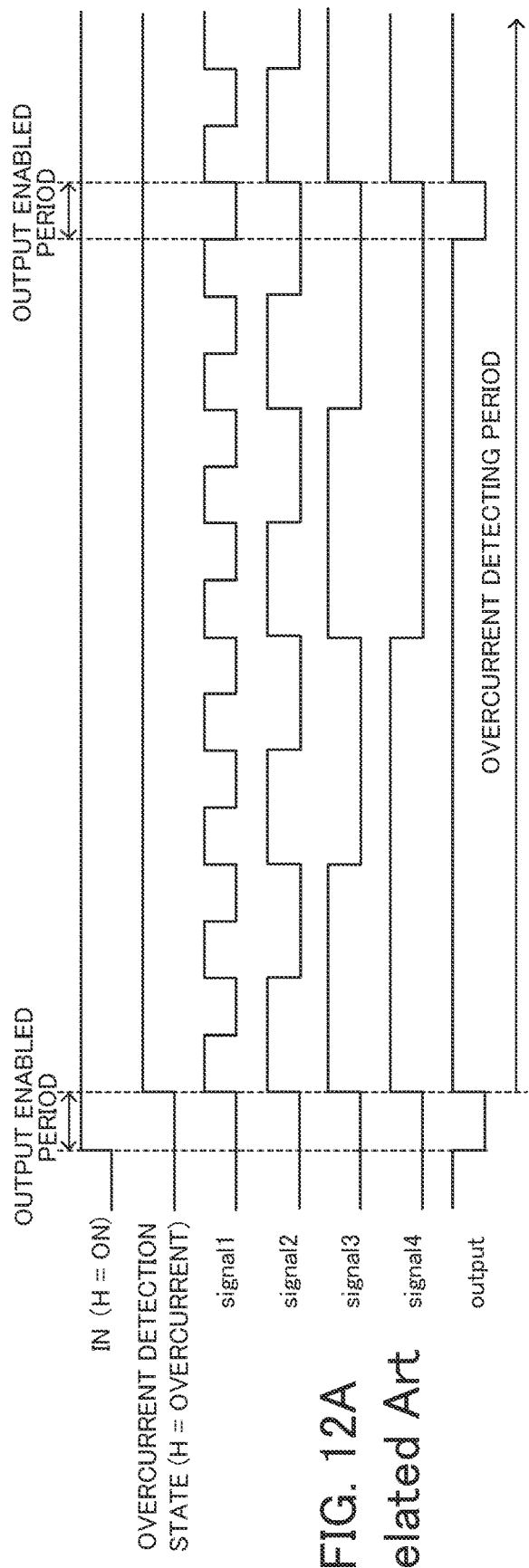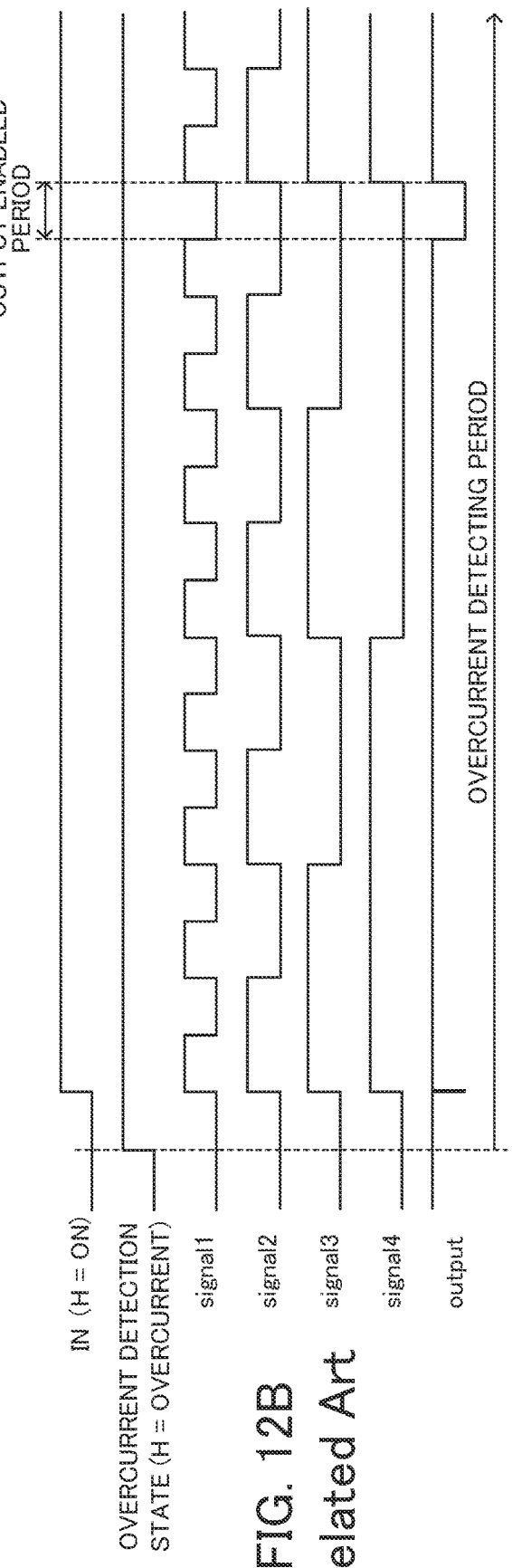

SEMICONDUCTOR DEVICE

CROSS-REFERENCE TO RELATED APPLICATIONS

This application is a continuation application of International Application PCT/JP2021/002585 filed on Jan. 26, 2021 which designated the U.S., which claims priority to Japanese Patent Application No. 2020-063843, filed on Mar. 31, 2020, and the Japanese Patent Application No. 2020-095640, filed on Jun. 1, 2020, the entire contents of which are incorporated herein by reference.

BACKGROUND OF THE INVENTION

1. Field of the Invention

The embodiment discussed herein relates to a semiconductor device including a power semiconductor element which is a voltage-driven power control element and circuits for driving and protecting the power semiconductor element.

2. Background of the Related Art

Automobiles are installed with a large number of semiconductor devices for exercising switching control of loads like motors. As such in-vehicle semiconductor devices, intelligent power switches (IPSs) are used, which integrate a power semiconductor element for supplying power to a load and control circuits for the power semiconductor element on the same chip. Commonly used IPSs, especially in automotive electrical component applications, are high-side IPSs, which are positioned between a power source and a load from a safety perspective during maintenance for the load.

As for semiconductor products used in automobile industries, designs that make no damage under any circumstances are needed. With regard to the high-side IPSs, when the load is in an overcurrent condition, excess current higher than that found in normal operation flows through the load, which may cause failures in the power semiconductor element and peripheral circuits.

There are some proposed technologies used in response to detection of an overcurrent situation (overcurrent condition), such as exercising control to limit current flow and adjusting an overcurrent detection threshold to limit an electric current (see, for example, International Publication Pamphlet No. WO 2017/187785). Especially, an overcurrent protection circuit disclosed in International Publication Pamphlet No. WO 2017/187785 is an implementation of technology of securing momentary current during normal operation while providing overcurrent protection according to a load.

Next described are a common high-side IPS, which is however different from the overcurrent protection circuit of International Publication Pamphlet No. WO 2017/187785, and specific operation taking place when the high-side IPS has detected an overcurrent situation. This common high-side IPS is based on the configuration described in the following non-patent literature: Sho NAKAGAWA, Takatoshi OE, and Motomitsu IWAMOTO, "One-Chip Linear Control IPS, "F5106H"", Fuji Electric Journal, Vol. 86, No. 4, Dec. 30, 2013, pp. 43-46.

FIG. 9 illustrates an example configuration of a conventional IPS. FIG. 10 is a block diagram illustrating example functions of a logic circuit upon detection of an overcurrent situation. FIG. 11 illustrates an example timing determination circuit. FIGS. 12A and 12B are timing diagrams regarding a first example operation of the timing determination circuit, with FIG. 12A depicting the case of an overcurrent situation being detected during ON operation and FIG. 12B depicting the case of an overcurrent situation being detected before ON operation. FIGS. 13A and 13B are waveform diagrams of the first example operation in response to the detection of an overcurrent situation, with the FIG. 13A depicting the case of the overcurrent situation being detected during ON operation and FIG. 13B depicting the case of the overcurrent situation being detected before ON operation. FIGS. 14A and 14B are timing diagrams regarding a second example operation of the timing determination circuit, with FIG. 14A depicting the case of an overcurrent situation being detected during ON operation and FIG. 14B depicting the case of an overcurrent situation being detected before ON operation. FIGS. 15A and 15B are waveform diagrams of the second example operation in response to the detection of an overcurrent situation, with the FIG. 15A depicting the case of the overcurrent situation being detected during ON operation and FIG. 15B depicting the case of the overcurrent situation being detected before ON operation. Note that in the description of FIG. 9 below the same reference numeral may be used to refer to the name of each terminal and a voltage, signal and the like at the terminal.

A conventional IPS 100 includes, as illustrated in FIG. 9, a main metal-oxide-semiconductor field-effect transistor (MOSFET) 110, a logic circuit 120, and a driver circuit 130. Note that the main MOSFET 110 may be configured as a circuit using an insulated gate bipolar transistor (IGBT) and a free wheeling diode (FWD) together, which are voltage-driven power control elements. The IPS 100 also includes a low voltage detection circuit 140, a short-circuit detection circuit 150, an overcurrent detection circuit 160, an overheat detection circuit 170, an N-channel MOSFET 180, a constant current circuit 182, an operational amplifier 190, and gain setting resistors 191, 192, 193, and 194.

The IPS 100 includes an IN terminal, a VCC terminal, an OUT terminal, an IN+ terminal, an IN− terminal, an AMP terminal, and a GND terminal. The IN terminal and the AMP terminal of the IPS 100 are connected to a microcomputer 200, which is a superior control unit. The microcomputer 200 generates signals to turn on and off the main MOSFET 110 based on a load current drawn from the AMP terminal of the IPS 100, and supplies them to the IN terminal of the IPS 100. In the example depicted in FIG. 9, a signal to turn on the main MOSFET 110 has a potential of 5 volts (V) while a signal to turn off the main MOSFET 110 has a potential of 0 V.

The IN terminal of the IPS 100 is connected to an input terminal of the logic circuit 120, whose output terminal is connected to an input terminal of the driver circuit 130 which has a level shifting function. An output terminal of the driver circuit 130 is connected to a gate terminal of the main MOSFET 110. A drain terminal of the main MOSFET 110 is connected to the VCC terminal, which is connected to an anode terminal of a power source 210. A cathode terminal of the power source 210 is connected to a reference potential (GND). A source terminal of the main MOSFET 110 is connected to the OUT terminal, which is connected to a first terminal of a load 220. A second terminal of the load 220 is connected to a first terminal of a shunt resistor 230, whose second terminal is connected to a reference potential. As for the shunt resistor 230, the first terminal is also connected to the IN+ terminal of the IPS 100, and the second terminal is also connected to the IN− terminal. The GND terminal of the IPS 100 is connected to a reference potential.

The VCC terminal of the IPS 100 is connected to an input terminal of the low voltage detection circuit 140, whose output terminal is connected to the logic circuit 120. The VCC terminal of the IPS 100 is also connected to a first input terminal of the short-circuit detection circuit 150, whose second input terminal is connected to the OUT terminal and output terminal is connected to the logic circuit 120. The VCC terminal of the IPS 100 is also connected to a drain terminal of a MOSFET 180, whose gate terminal is connected to the output terminal of the driver circuit 130. A source terminal of the MOSFET 180 is connected to a first terminal of the constant current circuit 182 and a first input terminal of the overcurrent detection circuit 160. A second input terminal of the overcurrent detection circuit 160 is connected to the OUT terminal, and an output terminal of the overcurrent detection circuit 160 is connected to the logic circuit 120. As for the overheat detection circuit 170, its output terminal is connected to the logic circuit 120. The IN+ terminal of the IPS 100 is connected to a first terminal of the gain setting resistor 191, whose second terminal is connected to a first terminal of the gain setting resistor 192 and a non-inverting input terminal of the operational amplifier 190. A second terminal of the gain setting resistor 192 is connected to a GND terminal. The IN− terminal of the IPS 100 is connected to a first terminal of the gain setting resistor 193, whose second terminal is connected to a first terminal of the gain setting resistor 194 and an inverting input terminal of the operational amplifier 190. An output terminal of the operational amplifier 190 is connected to a second terminal of the gain setting resistor 194 and the AMP terminal of the IPS 100.

The low voltage detection circuit 140 monitors whether a voltage VCC of the VCC terminal is greater than or equal to a predetermined voltage that makes the IPS 100 operable, and notifies the logic circuit 120 of an abnormal drop in the voltage VCC in response to the sag of the voltage VCC below the predetermined voltage. Upon the notification of the abnormal drop of the voltage VCC, the logic circuit 120 outputs a signal to disable the main MOSFET 110 and the MOSFET 180 to the driver circuit 130 in order to prevent the IPS 100 from performing abnormal operation.

The short-circuit detection circuit 150 detects, when the main MOSFET 110 is ON, a short circuit in the load 220 based on the difference in voltage between the VCC terminal and the OUT terminal. Upon detection of a short circuit failure of the load 220, the short-circuit detection circuit 150 notifies the logic circuit 120 of the failure, and the logic circuit 120 then outputs a signal to lower the gate voltages of the main MOSFET 110 and the MOSFET 180 to the driver circuit 130.

The overcurrent detection circuit 160 is configured to allow a constant current to flow in the constant current circuit 182 in response to the MOSFET 180 being turned on, and detect an overcurrent situation based on a potential difference due to the ON resistance of the main MOSFET 110 and the MOSFET 180, arising when the main MOSFET 110 and the MOSFET 180 are turned on. Upon detecting the load 220 being in an overcurrent condition, the overcurrent detection circuit 160 notifies the logic circuit 120 of the detection. In response to the notification, the logic circuit 120 disables the main MOSFET 110 and the MOSFET 180, and also controls the main MOSFET 110 and the MOSFET 180 to turn on periodically for only a brief period of time. This control is exercised to detect whether the load 220 has returned to its normal condition after the overcurrent detection. During this control action, the logic circuit 120 outputs a signal to disable the main MOSFET 110 and the MOSFET 180. Note that the threshold of the load current determined as an overcurrent situation by the overcurrent detection circuit 160 is set lower than the threshold of the load current determined as a short circuit failure by the short-circuit detection circuit 150.

The overheat detection circuit 170 detects the temperature of the main MOSFET 110 or the IPS 100, and notifies the logic circuit 120 of the main MOSFET 110 or the IPS 100 being in an overheated condition when the temperature of the main MOSFET 110 or the IPS 100 has reached or exceeded a predetermined temperature. Upon receiving the notification, the logic circuit 120 outputs a signal to disable the main MOSFET 110 and the MOSFET 180 to the driver circuit 130 in order to prevent malfunction of the IPS 100.

The operational amplifier 190 and the gain setting resistors 191, 192, 193, and 194 form a current detection circuit for detecting the value of the current flowing in the load 220 and notifying the microcomputer 200 of the detected value. The current flowing in the load 220 is converted by the shunt resistor 230 into voltage, which is amplified by the operational amplifier 190 and then supplied to the AMP terminal. The gain of the operational amplifier 190 at that time is set by the gain setting resistors 191, 192, 193, and 194.

The logic circuit 120 includes an input circuit 121, an oscillation signal generation circuit 122, and a timing determination circuit 123, as in FIG. 10 that depicts functions taking place in response to the detection of an overcurrent situation. The input circuit 121 is a circuit for inputting an input signal IN received at the IN terminal and used to turn on or off the main MOSFET 110. An output terminal of the input circuit 121 is connected to a first input terminal of the oscillation signal generation circuit 122, whose second input terminal is connected to the output terminal of the overcurrent detection circuit 160. An output terminal of the oscillation signal generation circuit 122 is connected to an input terminal of the timing determination circuit 123.

The input circuit 121 wave-shapes the input signal IN input thereto and then supplies the wave-shaped signal to the oscillation signal generation circuit 122. The oscillation signal generation circuit 122 generates an oscillation signal 'signal1' upon reception of an overcurrent detection signal from the overcurrent detection circuit 160 while the input circuit 121 is receiving the input signal IN to turn on the main MOSFET 110, and supplies the generated signal 'signal1' to the timing determination circuit 123. Also, when the input circuit 121 receives the input signal IN while the oscillation signal generation circuit 122 is receiving the overcurrent detection signal from the overcurrent detection circuit 160, the oscillation signal generation circuit 122 generates the oscillation signal 'signal1' and supplies the generated signal 'signal1' to the timing determination circuit 123. The timing determination circuit 123 outputs, based on the signal 'signal1', a signal 'output' indicating the time to periodically turn on the main MOSFET 110 for only a brief period of time.

The timing determination circuit 123 includes, as illustrated in FIG. 11, T flip-flops TFF1, TFF2, and TFF3, NOR circuits NOR1 and NOR2, and a NAND circuit NAND1. The input terminal of the timing determination circuit 123, which receives the signal 'signal1', is connected to an input terminal of the T flip-flop TFF1 and a first input terminal of the NOR circuit NOR1. An output terminal of the T flip-flop TFF1 is connected to an input terminal of the T flip-flop TFF2 and a second input terminal of the NOR circuit NOR1. An output terminal of the T flip-flop TFF2 is connected to an input terminal of the T flip-flop TFF3 and a first input terminal of the NOR circuit NOR2. An output terminal of the T flip-flop TFF3 is connected to a second input terminal of the NOR circuit NOR2. An output terminal of the NOR circuit NOR1 is connected to a first input terminal of the NAND circuit NAND1, and an output terminal of the NOR circuit NOR2 is connected to a second input terminal of the NAND circuit NAND1. An output terminal of the NAND circuit NAND1 serves as an output terminal of the timing determination circuit 123.

In the timing determination circuit 123, the signal 'signal1' received from the oscillation signal generation circuit 122 is sequentially frequency divided by a down counter circuit made up of the three stage T flip-flops TFF1, TFF2, and TFF3. That is, the T flip-flop TFF1 outputs a signal 'signal2' having a doubled frequency of the signal 'signal1', the T flip-flop TFF2 outputs a signal 'signal3' having a doubled frequency of the signal 'signal2', and the T flip-flop TFF3 outputs a signal 'signal4' having a doubled frequency of the signal 'signal3'. Upon reception of the signals 'signal1' and 'signal2', the NOR circuit NOR1 outputs a signal of high (H) level when both the signals 'signal1' and 'signal2' are at low (L) level. Upon reception of the signals 'signal3' and 'signal4', the NOR circuit NOR2 outputs a signal of H level when both the signals 'signal3' and 'signal4' are at L level. The NAND circuit NAND1 outputs the signal 'output' of L level only when receiving signals of H level from the NOR circuits NOR1 and NOR2. Herewith, the timing determination circuit 123 has a function of outputting the signal 'output' of L level in response to all the signals 'signal1', 'signal2', 'signal3', and 'signal4' being L-level signals. During a period in which an overcurrent situation is detected, the signal 'output' of L level is logically inverted when fed into the driver circuit 130 to be a signal to periodically turn on the main MOSFET 110 for only a brief period of time.

The foregoing timing determination circuit 123 operates according to the signal 'signal1' supplied from the oscillation signal generation circuit 122. The time for the signal 'signal1' to be generated may be different depending on the overcurrent detection signal from the overcurrent detection circuit 160 or the input signal IN. There are two cases: a first example operation where the oscillation signal generation circuit 122 generates the signal 'signal1' to rise in synchronization with the overcurrent detection signal or the input signal IN; and a second example operation where the oscillation signal generation circuit 122 generates the signal 'signal1' to rise with a delay of half a cycle after the detection of an overcurrent situation or an input of the input signal IN. First described are the operations of the timing determination circuit 123 and the IPS 100 in the first example operation.

FIGS. 12A and 13A depict the case where the detection of an overcurrent situation by the overcurrent detection circuit 160 takes place during an input of the input signal IN. Note that FIG. 12A depicts, from the top to the bottom, the input signal IN; overcurrent detection state of the overcurrent detection circuit 160; the signal 'signal1'; the signal 'signal2'; the signal 'signal3'; the signal 'signal4'; and the signal 'output' output from the timing determination circuit 123. FIG. 13A depicts, from the top to the bottom, the input signal IN; an output signal OUT of the OUT terminal; a load current IL; and a signal AMP of the AMP terminal.

First, as illustrated in FIG. 12A, when the main MOSFET 110 is turned on in response to an input of the input signal IN of H level, the overcurrent detection circuit 160 is outputting the signal of L level because having yet to detect an overcurrent situation. At this time, the oscillation signal generation circuit 122 outputs the signal 'signal1' of L level, and the T flip-flops TFF1, TFF2, and TFF3 of the timing determination circuit 123 output the signals 'signal2', 'signal3', and 'signal4' of L level because they are in the reset state. Therefore, the timing determination circuit 123 outputs the signal 'output' of L level, and the driver circuit 130 outputs a signal to keep the main MOSFET 110 ON.

When the main MOSFET 110 is in the ON state, the output signal OUT is output to the OUT terminal, as illustrated in FIG. 13A. Herewith, the load current IL starts flowing in the load 220, and the signal AMP of the AMP terminal has a waveform in accordance with that of the load current IL.

Next, when the overcurrent detection circuit 160 detects an overcurrent situation and then outputs the overcurrent detection signal of H level during the main MOSFET 110 being in the ON state, the oscillation signal generation circuit 122 outputs the signal 'signal1' that rises in synchronization with the rise of the H level overcurrent detection signal. In the timing determination circuit 123, an input of the signal 'signal1' of H level sets the remaining signals 'signal2', 'signal3', and 'signal4' also to H level. As a result, the timing determination circuit 123 outputs the signal 'output' of H level.

Upon detection of an overcurrent situation by the overcurrent detection circuit 160, the main MOSFET 110 is turned off, which results in a drop of the output signal OUT of the OUT terminal to almost 0 V, as illustrated in FIG. 13A. This decreases the load current IL flowing in the load 220 and also decreases the voltage of the signal AMP of the AMP terminal in the same fashion. At this time, because the load current IL does not decrease immediately, the voltage of the signal AMP of the AMP terminal also falls in like fashion to almost 0 V with a delay after the overcurrent detection. As a result, the microcomputer 200 learns of the overcurrent detection circuit 160 having detected an overcurrent situation late after the actual overcurrent detection.

In response to the overcurrent detection circuit 160 having detected an overcurrent situation, the oscillation signal generation circuit 122 and the timing determination circuit 123 operate to allow the signal 'output' to be output periodically. That is, as illustrated in FIG. 12A, the signal 'signal1' is sequentially frequency divided, and the signal 'output' is set to L level across an output enabled period where all the signals 'signal1', 'signal2', 'signal3', and 'signal4' are at L level. Because the main MOSFET 110 is turned on each time the signal 'output' of L level is output, the output signal OUT is output to the OUT terminal and the load current IL flows during that time. In this manner, the IPS 100 periodically checks whether the load 220 has returned to its normal state after the detection of an overcurrent situation.

The example of FIG. 13A depicts the case where the overcurrent condition of the load 220 has already been resolved when the third pulse of the signal 'output' following the overcurrent detection is output. In this case, normal energization of the load 220 is resumed. At this time, the signal AMP, whose magnitude corresponds to that of the load current IL, is output to the AMP terminal after a delay in recovery from the overcurrent situation.

At the end when the input signal IN is set to L level, the main MOSFET 110 is turned off, which results in a drop of the output signal OUT of the OUT terminal to almost 0 V. This initiates a decrease in the load current IL flowing in the load 220, and therefore the signal AMP of the AMP terminal also starts decreasing.

Next described is the case where the detection of an overcurrent situation by the overcurrent detection circuit 160 takes place before an input of the input signal IN, with reference to FIGS. 12B and 13B. Note that FIG. 12B depicts, from the top to the bottom, the input signal IN; the overcurrent detection state of the overcurrent detection circuit 160; the signal 'signal1'; the signal 'signal2'; the signal 'signal3'; the signal 'signal4'; and the signal 'output' output from the timing determination circuit 123. FIG. 13B depicts, from the top to the bottom, the input signal IN; the output signal OUT of the OUT terminal; the load current IL; and the signal AMP of the AMP terminal.

When the input signal IN of H level is input while the overcurrent detection signal is being output, the oscillation signal generation circuit 122 outputs the signal 'signal1' which rises at the time of the input of the input signal IN. After the signal 'signal1' of H level is output, the timing determination circuit 123 operates in a similar manner as in the case illustrated in FIG. 12A above.

When the input signal IN of H level is input while an overcurrent situation has been detected, first, the main MOSFET 110 is turned on and the output signal OUT is output to the OUT terminal, as illustrated in FIG. 13B. At this time, the load current IL starts flowing in the load 220, and the signal AMP output to the AMP terminal has a magnitude corresponding to that of the load current IL.

When the input signal IN of H level is input, an overcurrent situation has already been detected, and the main MOSFET 110 is therefore turned off immediately after the input of the H-level input signal IN. In response, the output signal OUT of the OUT terminal falls to almost 0 V. Immediately after this, the load current IL decreases, and the signal AMP of the AMP terminal also drops right away. When the signal AMP falls to almost 0 V, the microcomputer 200 learns of the overcurrent detection circuit 160 having detected an overcurrent situation late after the input of the input signal IN of H level.

Subsequent operations are the same as in FIG. 13A above, including periodic outputs of the signal 'output' during the H-level input signal IN being input for the purpose of checking if the load 220 has returned to its normal condition and the operation launched after resolution of the overcurrent condition of the load 220.

Next described are the operations of the timing determination circuit 123 and the IPS 100 in the second example operation where the oscillation signal generation circuit 122 sets the signal 'signal1' to rise with a delay of half a cycle after the detection of an overcurrent situation or an input of the input signal IN.

FIGS. 14A and 15A depict the case where the detection of an overcurrent situation by the overcurrent detection circuit 160 takes place during an input of the input signal IN. Note that FIG. 14A depicts, from the top to the bottom, the input signal IN; the overcurrent detection state of the overcurrent detection circuit 160; the signal 'signal1'; the signal 'signal2'; the signal 'signal3'; the signal 'signal4'; and the signal 'output' output from the timing determination circuit 123. FIG. 15A depicts, from the top to the bottom, the input signal IN; the output signal OUT of the OUT terminal; the load current IL; and the signal AMP of the AMP terminal.

First, as illustrated in FIG. 14A, when the main MOSFET 110 is turned on in response to an input of the input signal IN of H level, the overcurrent detection circuit 160 is outputting the signal of L level because having yet to detect an overcurrent situation. At this time, the oscillation signal generation circuit 122 outputs the signal 'signal1' of L level. The timing determination circuit 123 outputs the signal 'output' of L level, and the driver circuit 130 outputs a signal to keep the main MOSFET 110 ON.

At this time, as illustrated in FIG. 15A, the main MOSFET 110 is turned on, which causes the output signal OUT to be output to the OUT terminal. Herewith, the load current IL starts flowing in the load 220, and the signal AMP of the AMP terminal has a waveform in accordance with that of the load current IL.

Next, when the overcurrent detection circuit 160 detects an overcurrent situation and then outputs an overcurrent detection signal of H level, the oscillation signal generation circuit 122 outputs the signal 'signal1' that rises with a delay of half a cycle after the rise of the overcurrent detection signal to H level. Subsequent operations after the output of the signal 'signal1' of H level are the same as in the first example operation of FIGS. 12A and 13A above.

Next described is the case where the detection of an overcurrent situation by the overcurrent detection circuit 160 takes place before an input of the input signal IN, with reference to FIGS. 14B and 15B. Note that FIG. 14B depicts, from the top to the bottom, the input signal IN; the overcurrent detection state of the overcurrent detection circuit 160; the signal 'signal1'; the signal 'signal2'; the signal 'signal3'; the signal 'signal4'; and the signal 'output' output from the timing determination circuit 123. FIG. 15B depicts, from the top to the bottom, the input signal IN; the output signal OUT of the OUT terminal; the load current IL; and the signal AMP of the AMP terminal.

When the input signal IN of H level is input while the overcurrent detection signal is being output, the oscillation signal generation circuit 122 generates the signal 'signal1' which starts with L level at the time of the input of the input signal IN. For this reason, it takes half a cycle for the signal 'signal1' to rise to H level. Until then, the signal 'output' output from the timing determination circuit 123 is enabled, and the main MOSFET 110 therefore remains ON. Subsequent operations after the signal 'signal1' has first risen to H level are the same as in FIGS. 14A and 15A above.

Note that, in FIGS. 12A, 12B, 14A, and 14B, the signal 'output' is set to H level when the input signal IN is at L level. This is because the signal 'output' is configured to be set to H level by a circuit not illustrated when the input signal IN is at L level.

However, in the first example operation, especially when an overcurrent situation is detected before an input of the input signal IN, the main MOSFET 110 is turned on and then off soon after the input signal IN of H level is input, as illustrated in FIG. 13B. This causes the signal AMP of the AMP terminal to have a narrow pulse width. Therefore, by receiving the signal AMP with narrow width, the microcomputer 200 may not only be unable to detect the load current IL risen in response to an instruction to turn on the main MOSFET 110 but may also be unable to learn of the detected overcurrent situation. On the other hand, in the second example operation, when an overcurrent situation is detected after the input of the input signal IN, there is a period during which an overcurrent flows following the condition where normal load current is flowing, as illustrated in FIG. 15A. As a result, the main MOSFET 110 is liable to become overheated and thus likely to fail.

SUMMARY OF THE INVENTION

According to an aspect, there is provided a semiconductor device including a power semiconductor element; an overcurrent detection circuit configured to detect an overcurrent situation; and a logic circuit configured to output a first output signal that turns off the power semiconductor element after the overcurrent detection circuit detects the overcurrent situation, wherein: the logic circuit includes a pulse generation circuit configured to output a pulse upon receiving an input signal that turns on the power semiconductor element, and the logic circuit outputs, upon detection of the overcurrent situation by the overcurrent detection circuit while the pulse is being output, a second output signal that turns on the power semiconductor element for a predetermined period of time after the detection of the overcurrent situation.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 12A and 12B are timing diagrams regarding a first example operation of the timing determination circuit, with FIG. 12A depicting a case of an overcurrent situation being detected during ON operation and FIG. 12B depicting a case of an overcurrent situation being detected before ON operation;

DETAILED DESCRIPTION OF THE INVENTION

Figure 9:
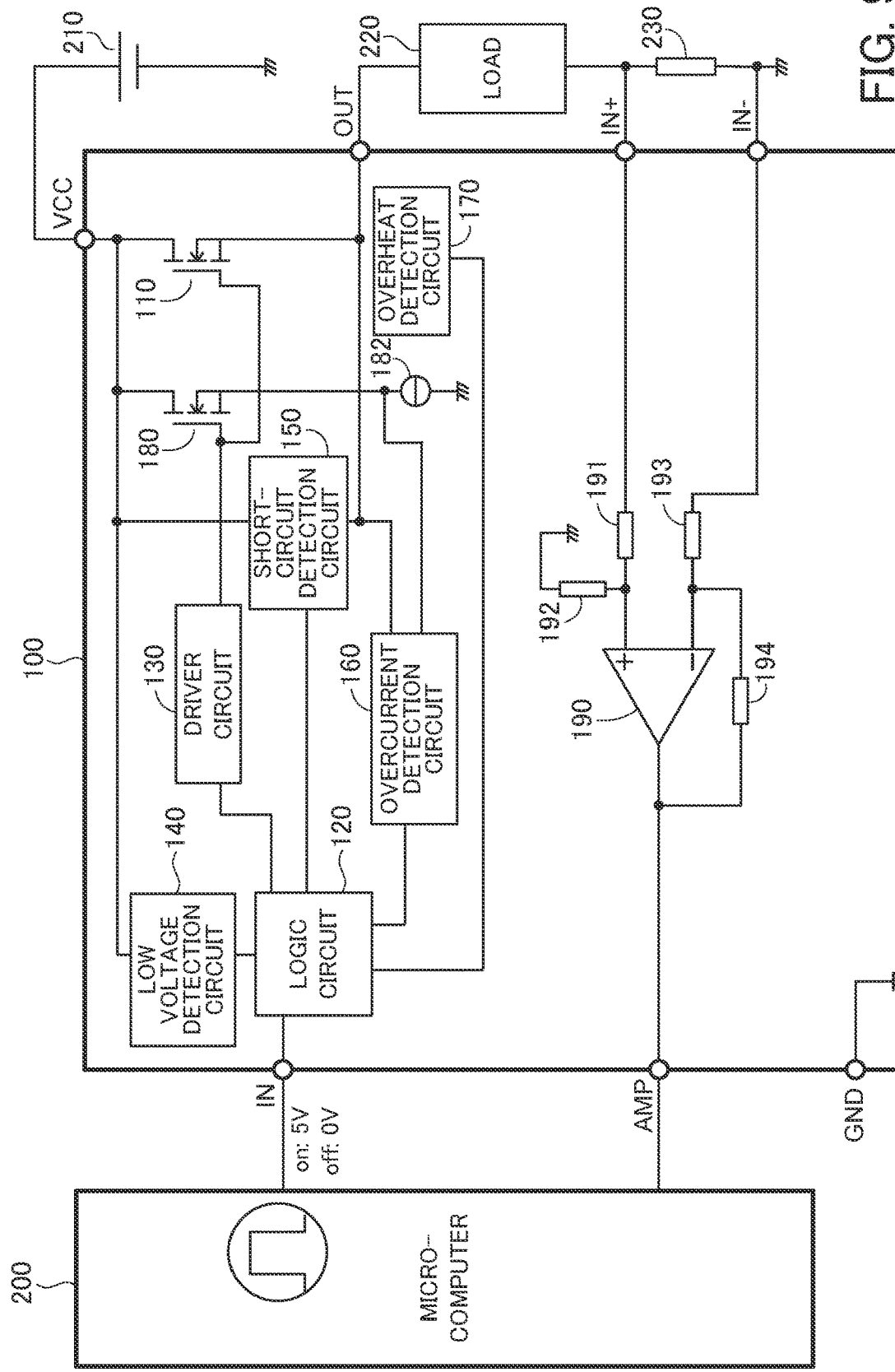
FIG. 9 illustrates an example configuration of a conventional IPS.
Figure 10:
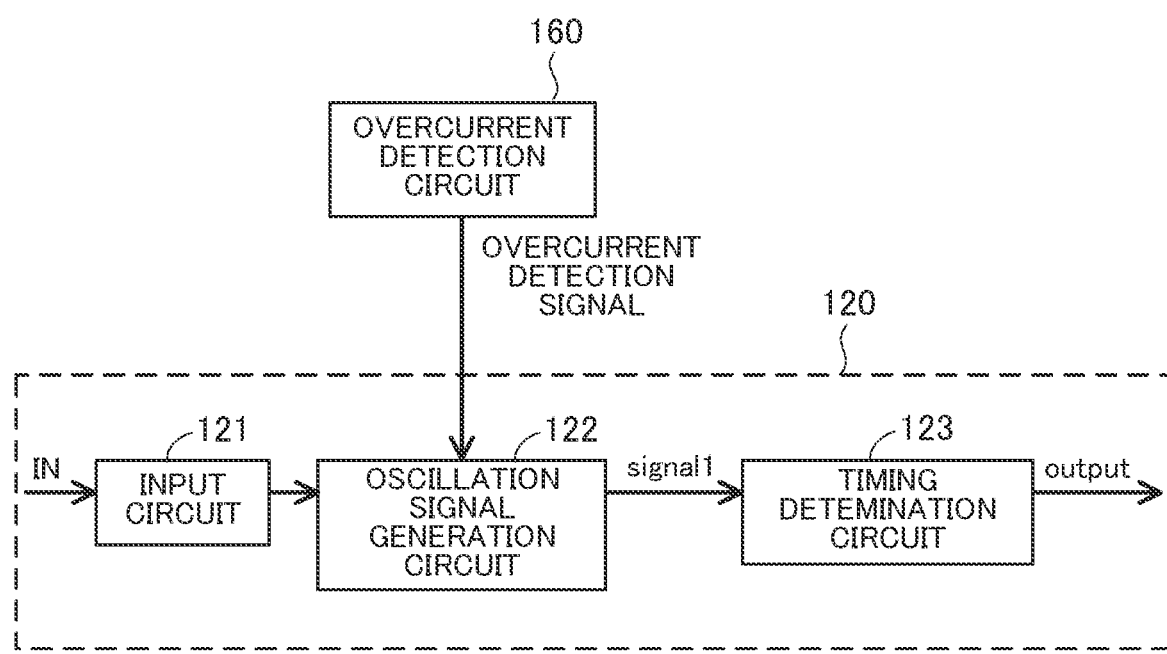
FIG. 10 is a block diagram illustrating example functions of a logic circuit upon detection of an overcurrent situation.
Figure 11:
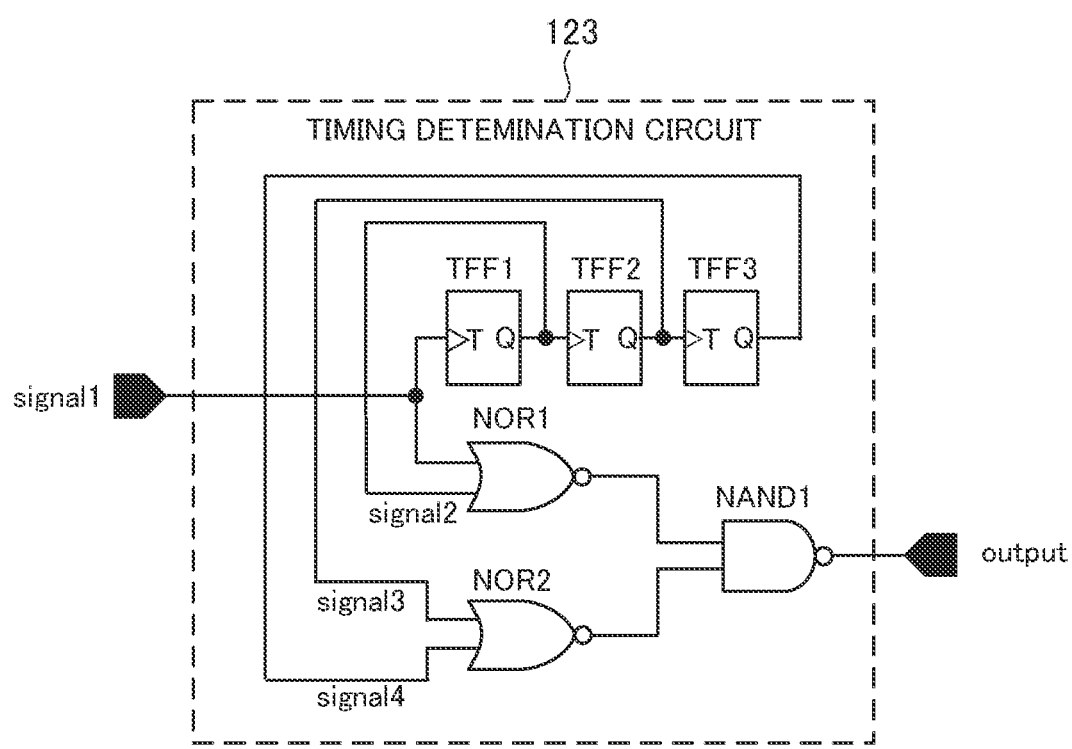
FIG. 11 illustrates an example timing determination circuit.
Figure 13A:
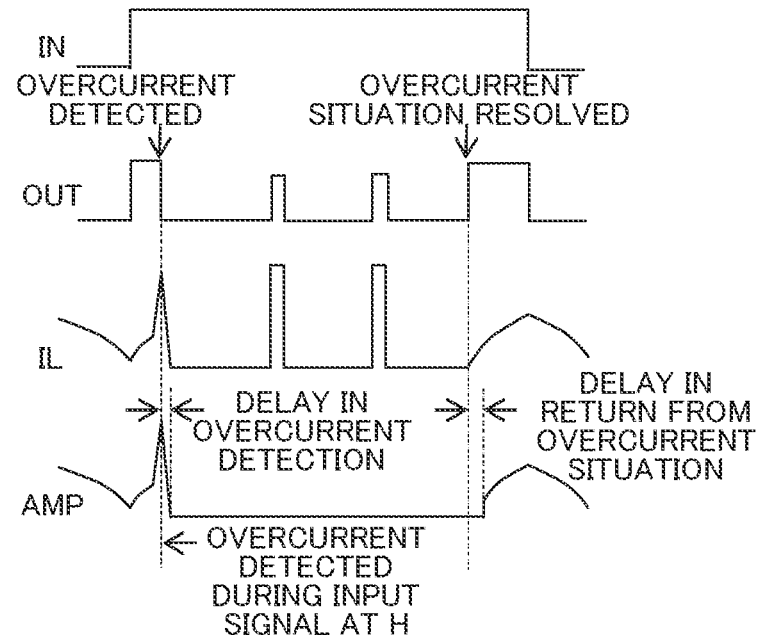
FIGS. 13A and 13B are waveform diagrams of the first example operation in response to the detection of an overcurrent situation, with the FIG. 13A depicting the case of the overcurrent situation being detected during ON operation and FIG. 13B depicting the case of the overcurrent situation being detected before ON operation.
Figure 13B:
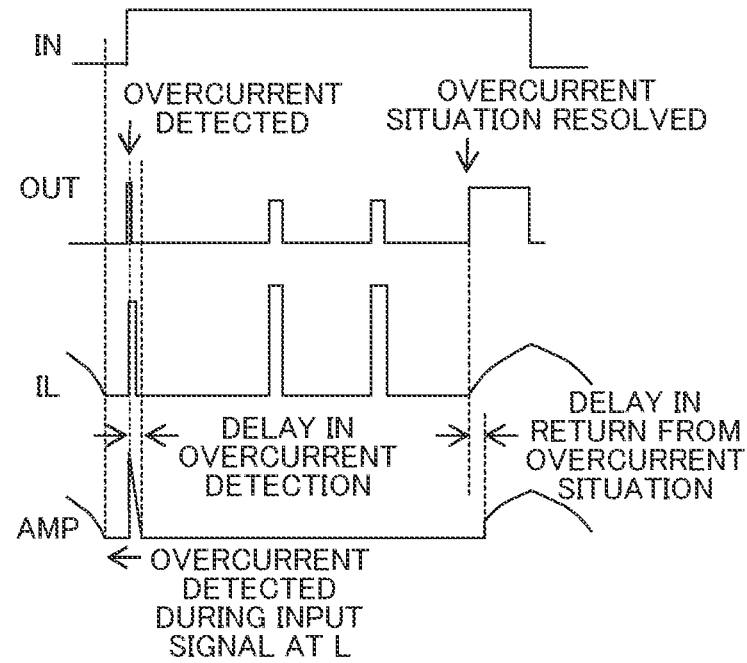
Figure 14A:
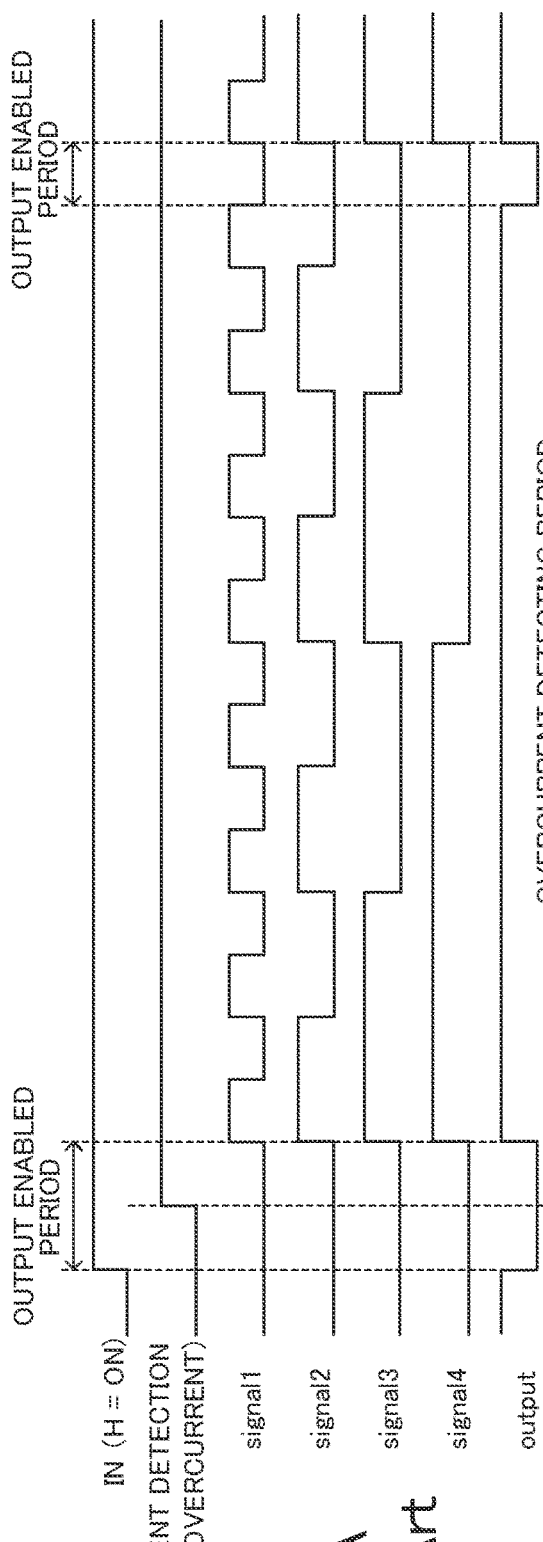
FIGS. 14A and 14B are timing diagrams regarding a second example operation of the timing determination circuit, with FIG. 14A depicting the case of an overcurrent situation being detected during ON operation and FIG. 14B depicting the case of an overcurrent situation being detected before ON operation.
Figure 14B:
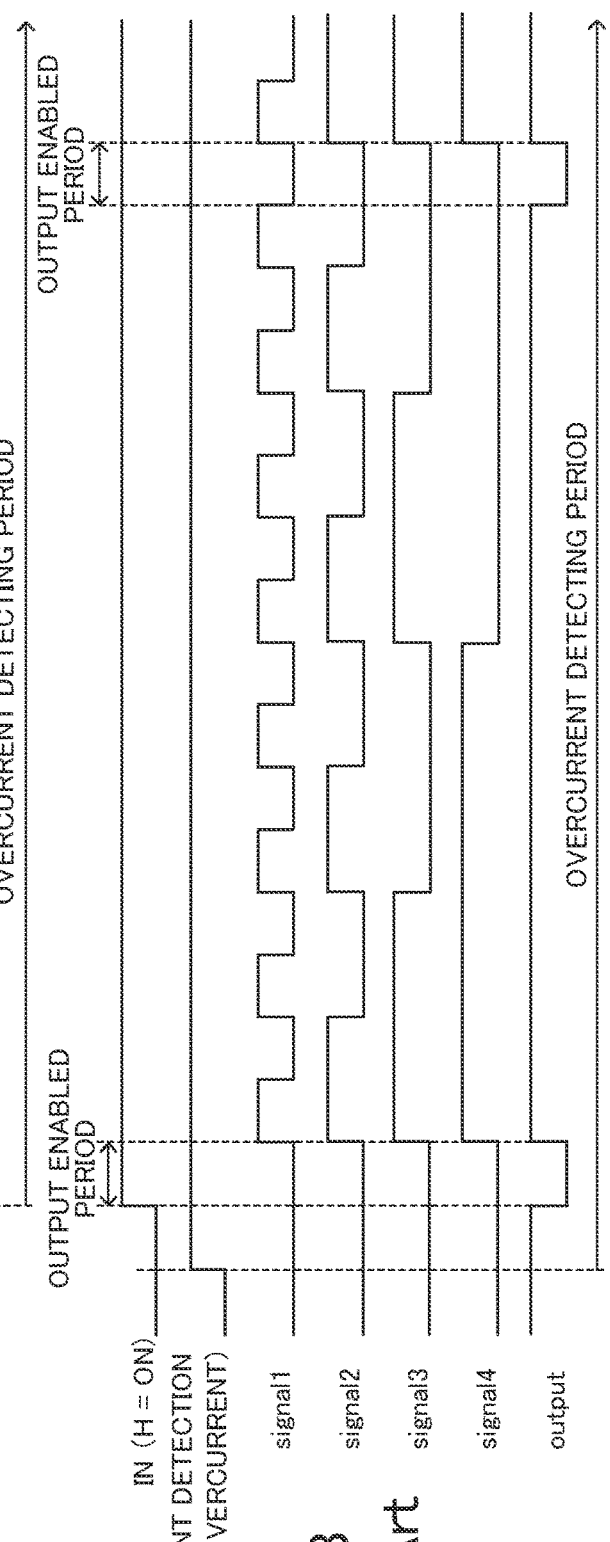
Figure 15A:
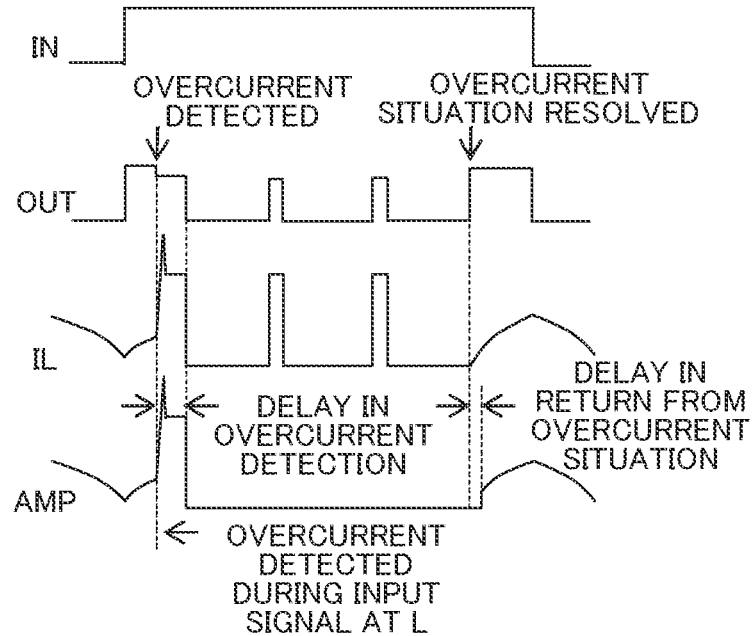
FIGS. 15A and 15B are waveform diagrams of the second example operation in response to the detection of an overcurrent situation, with the FIG. 15A depicting the case of the overcurrent situation being detected during ON operation and FIG. 15B depicting the case of the overcurrent situation being detected before ON operation.
Figure 15B:
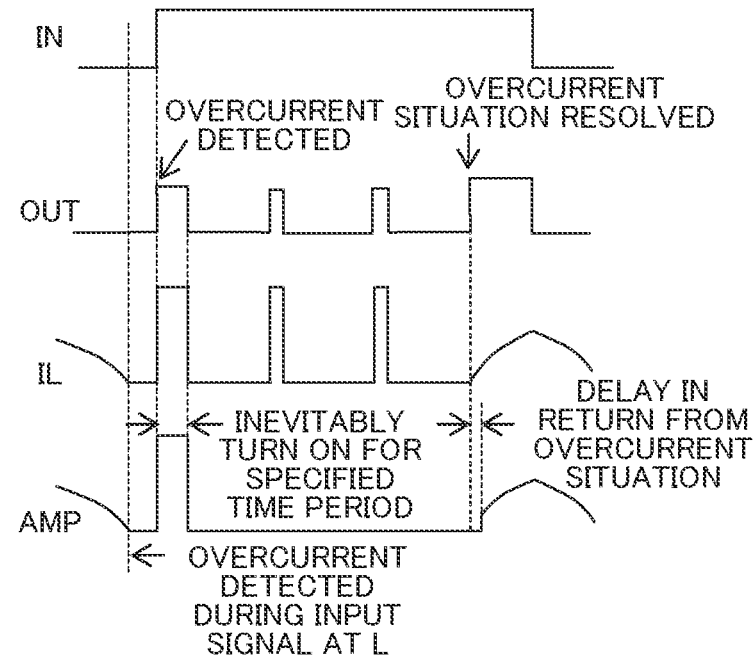

A preferred embodiment will be described hereinafter in detail in relation with an example of application to a high-side IPS, with reference to the accompanying drawings. Note that the basic configuration of the high-side IPS is the same as that described in FIG. 9 above, and therefore the description of components other than the logic circuit, which is a distinctive feature of the preferred embodiment, may refer to FIG. 9.

Figure 1:
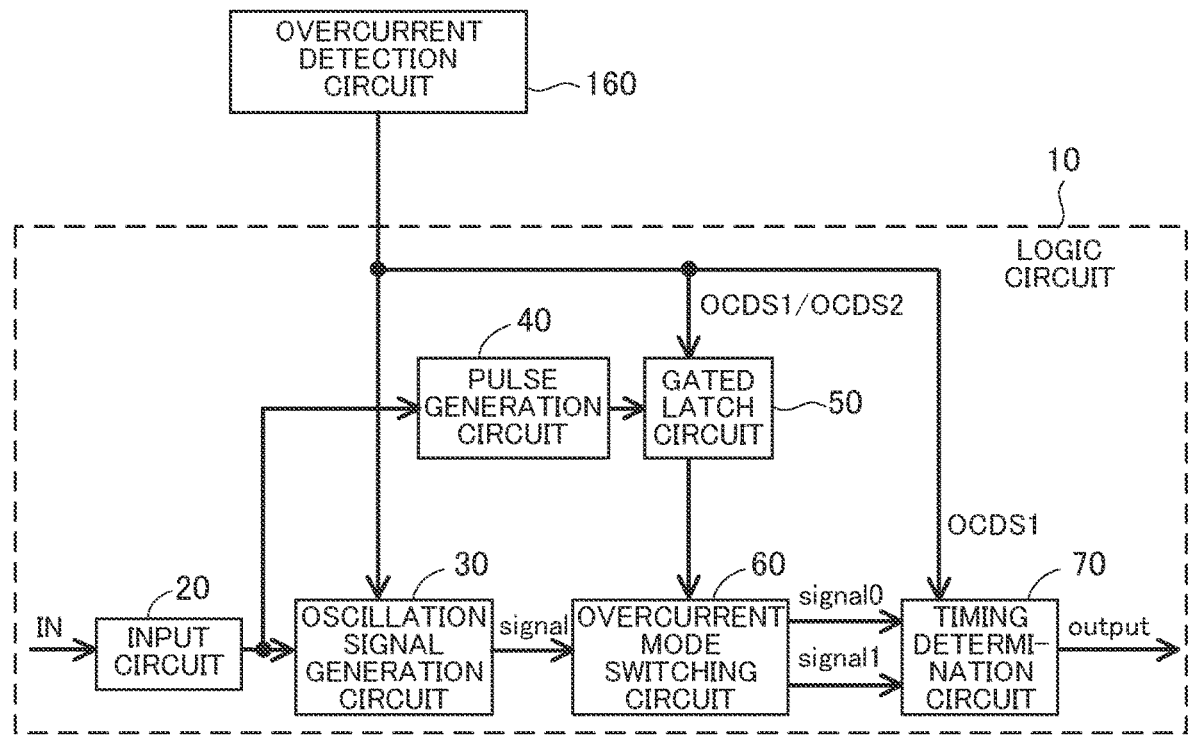
FIG. 1 is a block diagram illustrating an example configuration of a logic circuit of a high-side IPS according to a preferred embodiment.
Figure 2:
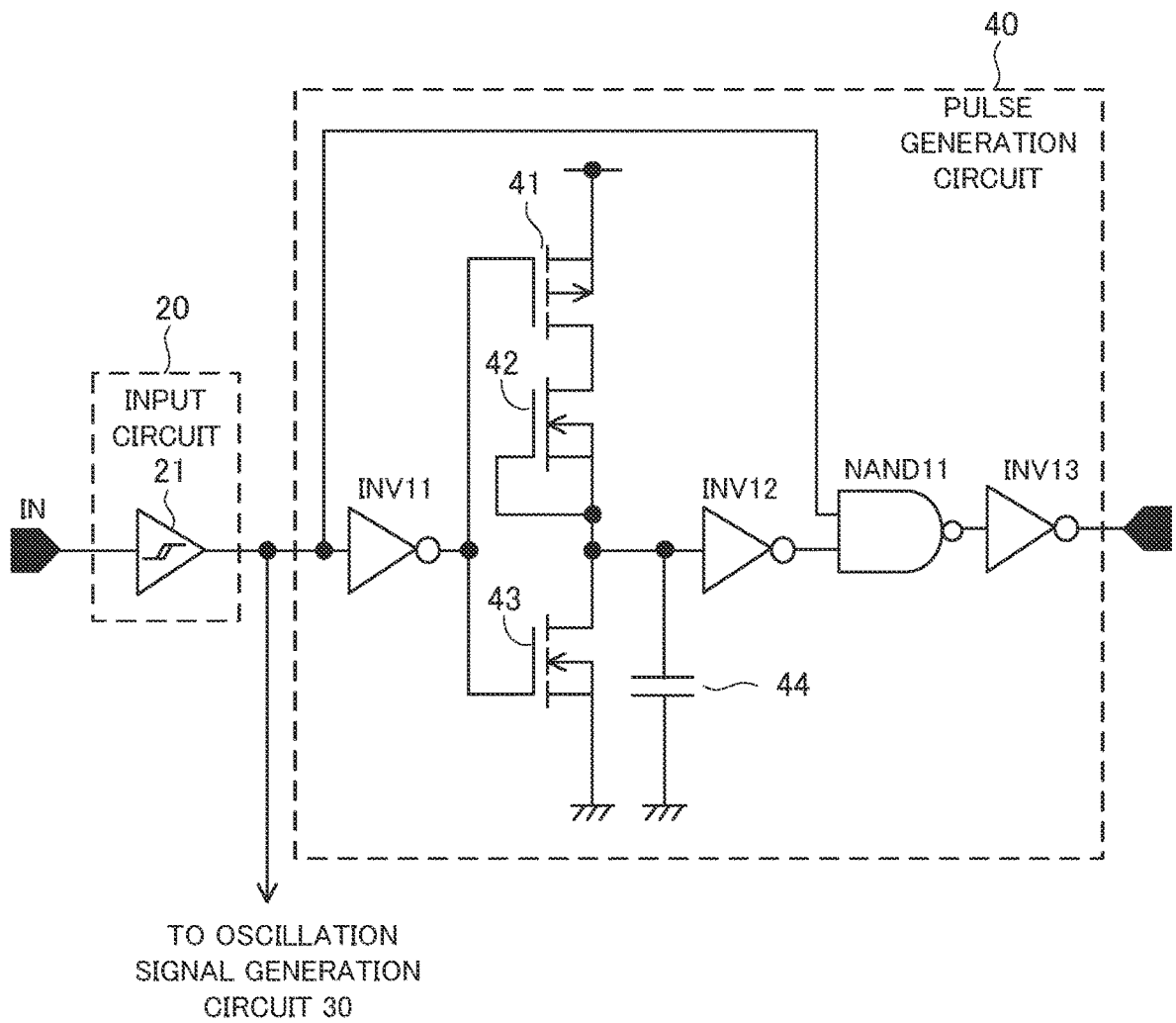
FIG. 2 is a circuit diagram illustrating an example input circuit and pulse generation circuit.
Figure 3:
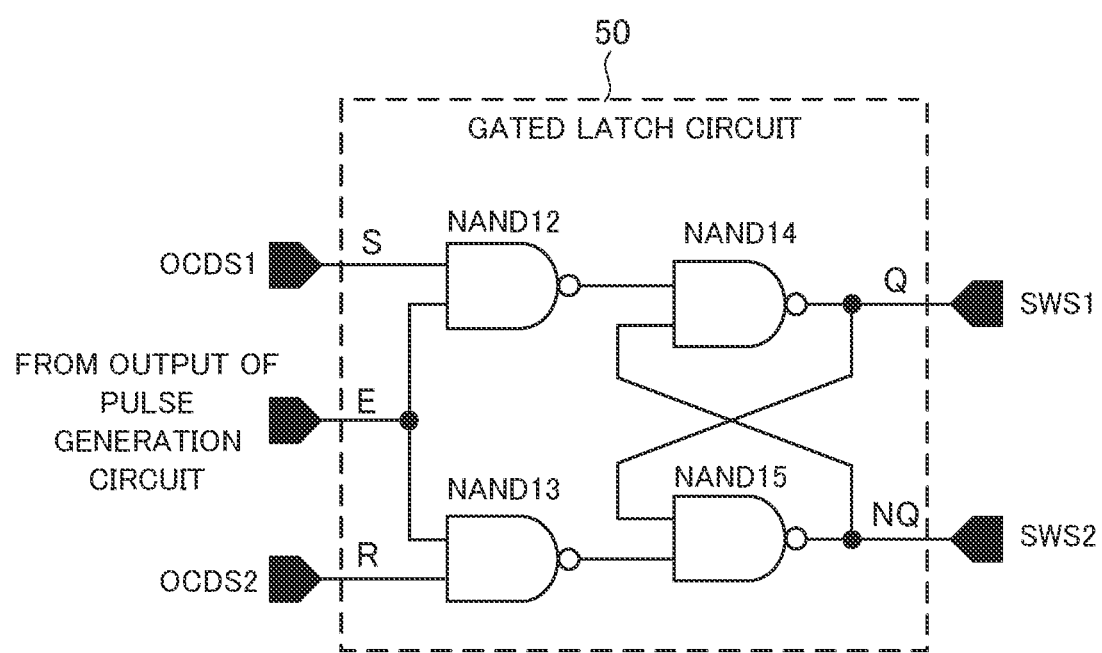
FIG. 3 is a circuit diagram illustrating an example gated latch circuit.
Figure 4:
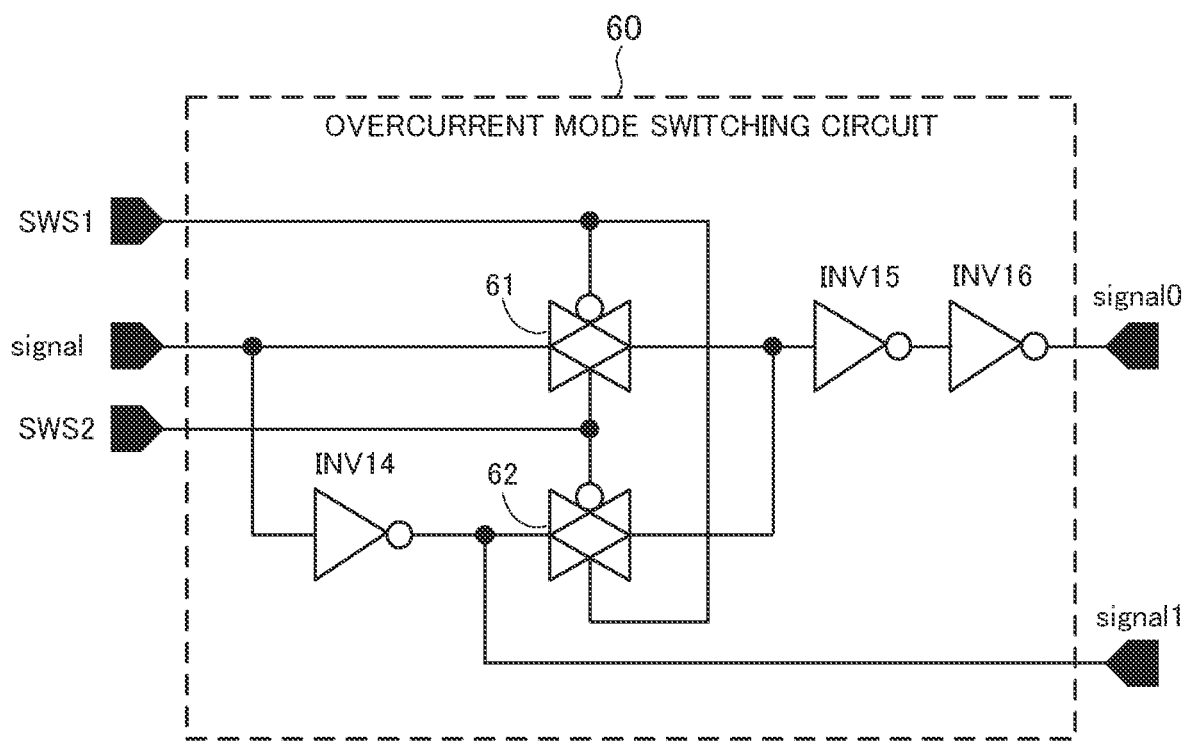
FIG. 4 is a circuit diagram illustrating an example overcurrent mode switching circuit.
Figure 5:
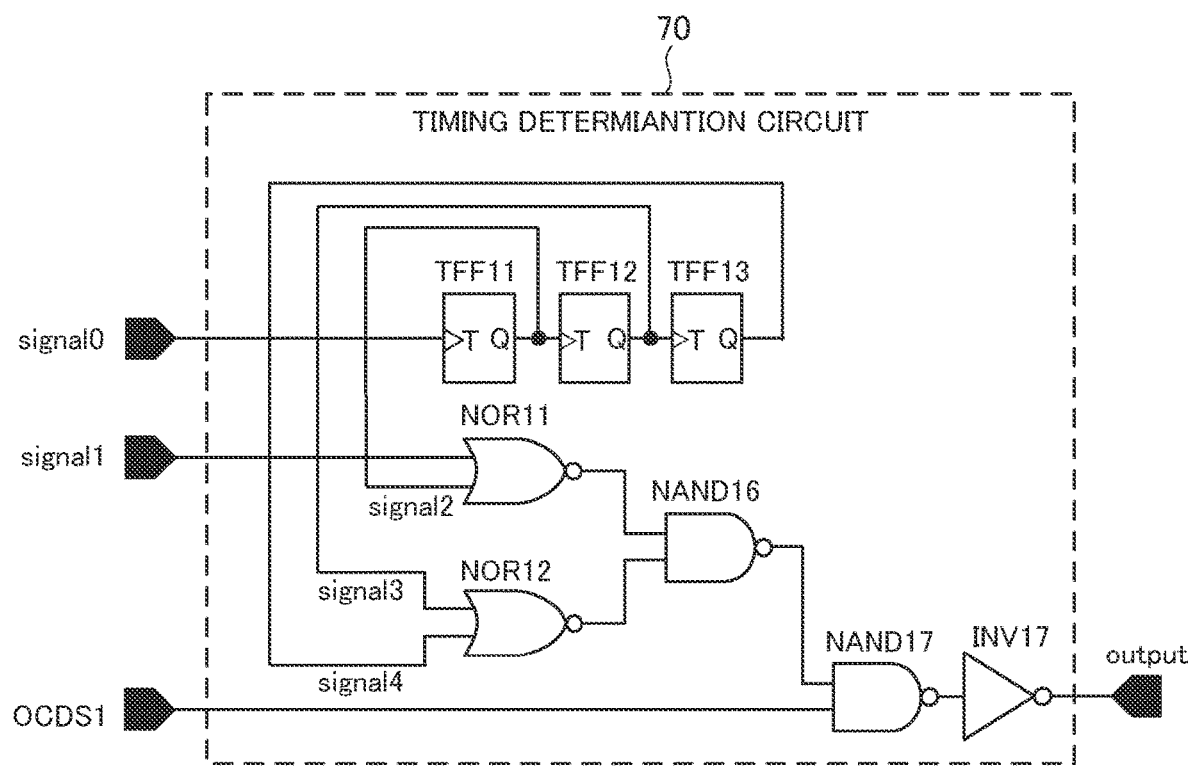
FIG. 5 is a circuit diagram illustrating an example timing determination circuit.

FIG. 1 is a block diagram illustrating an example configuration of a logic circuit of a high-side IPS according to the preferred embodiment. FIG. 2 is a circuit diagram illustrating an example input circuit and pulse generation circuit. FIG. 3 is a circuit diagram illustrating an example gated latch circuit. FIG. 4 is a circuit diagram illustrating an example overcurrent mode switching circuit. FIG. 5 is a circuit diagram illustrating an example timing determination circuit. Note that in the description of the drawings below the same reference numeral may be used to refer to the name of each terminal and a voltage, signal and the like at the terminal.

A logic circuit 10 of a high-side IPS according to the preferred embodiment includes, as illustrated in FIG. 1, an input circuit 20, an oscillation signal generation circuit 30, a pulse generation circuit 40, a gated latch circuit 50, an overcurrent mode switching circuit 60, and a timing determination circuit 70.

As for the input circuit 20, its input terminal is connected to an IN terminal of the high-side IPS, and its output terminal is connected to a first input terminal of the oscillation signal generation circuit 30 and an input terminal of the pulse generation circuit 40. A second input terminal of the oscillation signal generation circuit 30 is connected to the output terminal of the overcurrent detection circuit 160. An output terminal of the pulse generation circuit 40 is connected to an enable terminal of the gated latch circuit 50. Another input terminal of the gated latch circuit 50 is connected to the output terminal of the overcurrent detection circuit 160, and an output terminal of the gated latch circuit 50 is connected to a switching signal input terminal of the overcurrent mode switching circuit 60. An oscillation signal input terminal of the overcurrent mode switching circuit 60 is connected to an output terminal of the oscillation signal generation circuit 30. An output terminal of the overcurrent mode switching circuit 60 is connected to an input terminal of the timing determination circuit 70. The timing determination circuit 70 is configured to also receive a first overcurrent detection signal OCDS1 output from the overcurrent detection circuit 160.

The input circuit 20 includes, as illustrated in FIG. 2, a non-inverting Schmitt trigger circuit 21. An input terminal of the Schmitt trigger circuit 21 is connected to the IN terminal of the high-side IPS, and an output terminal thereof is connected to the input terminal of the pulse generation circuit 40. The input circuit 20 is able to wave-shape the input signal IN including noise, supplied from the microcomputer 200.

The pulse generation circuit 40 includes inverter circuits INV11, INV12, and INV13, a NAND circuit NAND11, a P-channel MOSFET 41, N-channel MOSFETs 42 and 43, and a capacitor 44. Note that the MOSFET 42 is a depression MOSFET.

The input terminal of the pulse generation circuit 40 is connected to an input terminal of the inverter circuit INV11 and a first input terminal of the NAND circuit NAND11. An output terminal of the inverter circuit INV11 is connected to gate terminals of the MOSFETs 41 and 43. A source terminal of the MOSFET 41 is connected to a power source line, and a source terminal of the MOSFET 43 is connected to a ground line. A drain terminal of the MOSFET 41 is connected to a drain terminal of the MOSFET 42, a gate terminal and a source terminal of the MOSFET 42 are connected to a drain terminal of the MOSFET 43, a first terminal of the capacitor 44, and an input terminal of the inverter circuit INV12. A second terminal of the capacitor 44 is connected to a ground line. An output terminal of the inverter circuit INV12 is connected to a second input terminal of the NAND circuit NAND11, and an output terminal of the NAND circuit NAND11 is connected to an input terminal of the inverter circuit INV13. An output terminal of the inverter circuit INV13 serves as an output terminal of the pulse generation circuit 40.

When an input signal of L level is input to the input terminal of the pulse generation circuit 40, the input signal is inverted by the inverter circuit INV11 from L to H level. Herewith, a gate voltage of H level is applied to the gate terminal of each of the MOSFETs 41 and 43, which turns off the MOSFET 41 and turns on the MOSFET 43. As a result, the capacitor 44 is discharged by the MOSFET 43. At this time, the inverter circuit INV12 outputs a signal of H level, which is applied to the second input terminal of the NAND circuit NAND11. To the first input terminal of the NAND circuit NAND11, the input signal of L level input to the pulse generation circuit 40 is applied. Therefore, the NAND circuit NAND11 outputs a signal of H level, which is then inverted by the inverter circuit INV13 to L level and supplied to the output terminal of the pulse generation circuit 40.

On the other hand, when an input signal of H level is input to the input terminal of the pulse generation circuit 40, the input signal is inverted by the inverter circuit INV11 from H to L level. Herewith, a gate voltage of L level is applied to the gate terminal of each of the MOSFETs 41 and 43, which turns on the MOSFET 41 and turns off the MOSFET 43. At this time, a constant current that flows when the gate-to-source voltage is 0 V is delivered to the depression MOSFET 42 and charges the capacitor 44. At the start of the charging, because the voltage of the capacitor has yet reached a threshold voltage of the inverter circuit INV12, the inverter circuit INV12 outputs a signal of H level. As a result, H-level signals are applied to both input terminals of the NAND circuit NAND11, and the NAND circuit NAND11 therefore outputs a signal of L level, which is then inverted by the inverter circuit INV13 to H level and supplied to the output terminal of the pulse generation circuit 40.

Subsequently, as the charge voltage of the capacitor 44 being charged with the constant current by the MOSFET 42 has reached the threshold voltage of the inverter circuit INV12, the inverter circuit INV12 outputs a signal of L level. Consequently, because the second input terminal of the NAND circuit NAND11 receives the L-level signal, the NAND circuit NAND11 outputs a signal of H level, which is then inverted by the inverter circuit INV13 to L level and supplied to the output terminal of the pulse generation circuit 40.

Specifically, the pulse generation circuit 40 generates and outputs a H-level pulse for a given length of time, which is determined by the depression MOSFET 42, the capacitor 44, and the inverter circuit INV12, upon receiving, at the IN terminal, the input signal IN that instructs to turn on the main MOSFET 110.

The gated latch circuit 50 includes, as illustrated in FIG. 3, NAND circuits NAND12 and NAND13 forming a gate circuit and NAND circuits NAND14 and NAND15 forming a latch circuit. A first input terminal of the NAND circuit NAND12 is connected to a set terminal S of the gated latch circuit 50, and a first input terminal of the NAND circuit NAND13 is connected to a reset terminal R of the gated latch circuit 50. Second input terminals of the NAND circuits NAND12 and NAND13 are connected to an enable terminal E of the gated latch circuit 50. An output terminal of the NAND circuit NAND12 is connected to a first input terminal of the NAND circuit NAND14, and an output terminal of the NAND circuit NAND13 is connected to a first input terminal of the NAND circuit NAND15. A second input terminal of the NAND circuit NAND14 is connected to an output terminal of the NAND circuit NAND15, and a second input terminal of the NAND circuit NAND15 is connected to an output terminal of the NAND circuit NAND14. The output terminal of the NAND circuit NAND14 is connected to an output terminal Q of the gated latch circuit 50, and an output terminal of the NAND circuit NAND15 is connected to an inverting output terminal NQ of the gated latch circuit 50.

In the gated latch circuit 50, the first overcurrent detection signal OCDS1 output from the overcurrent detection circuit 160 is input to the set terminal S, and a second overcurrent detection signal OCDS2 output from the overcurrent detection circuit 160 is input to the reset terminal R. According to the preferred embodiment, the first overcurrent detection signal OCDS1 is a signal to be output at H level when the overcurrent detection circuit 160 has detected an overcurrent situation. The second overcurrent detection signal OCDS2 is a signal obtained by inverting the first overcurrent detection signal OCDS1. An enable terminal E of the gated latch circuit 50 is connected to the output terminal of the pulse generation circuit 40.

Upon receiving a pulse of H level at the enable terminal E from the pulse generation circuit 40, the gated latch circuit 50 latches the first overcurrent detection signal OCDS1 of the set terminal S and the second overcurrent detection signal OCDS2 of the reset terminal R to hold an overcurrent detection state of the overcurrent detection circuit 160. When having detected no overcurrent situation, the overcurrent detection circuit 160 outputs the first overcurrent detection signal OCDS1 of L level and the second overcurrent detection signal OCDS2 of H level. When having detected an overcurrent situation, on the other hand, the overcurrent detection circuit 160 outputs the first overcurrent detection signal OCDS1 of H level and the second overcurrent detection signal OCDS2 of L level.

If no overcurrent situation has been detected upon reception of a pulse of H level, the gated latch circuit 50 maintains the first overcurrent detection signal OCDS1 of L level and outputs a first switching signal SWS1 of L level to the output terminal Q, and maintains the second overcurrent detection signal OCDS2 of H level and outputs the second switching signal SWS2 of H level to the inverting output terminal NQ. On the other hand, if an overcurrent situation has been detected upon reception of a pulse of H level, the gated latch circuit 50 maintains the first overcurrent detection signal OCDS1 of H level and outputs the first switching signal SWS1 of H level to the output terminal Q, and maintains the second overcurrent detection signal OCDS2 of L level and outputs the second switching signal SWS2 of L level to the inverting output terminal NQ.

The overcurrent mode switching circuit 60 includes, as illustrated in FIG. 4, inverter circuits INV14, INV15, and INV16 and transmission gates 61 and 62 forming a switch circuit. The overcurrent mode switching circuit 60 includes an input terminal for receiving a signal 'signal' generated by the oscillation signal generation circuit 30 as well as input terminals for receiving the first switching signal SWS1 and the second switching signal SWS2 output from the gated latch circuit 50. The overcurrent mode switching circuit 60 also includes output terminals for outputting signals 'signal0' and 'signal1' generated based on the signal 'signal'.

The input terminal of the signal 'signal' is connected to a first terminal of the transmission gate 61 and an input terminal of the inverter circuit INV14. An output terminal of the inverter circuit INV14 is connected to a first terminal of the transmission gate 62 and an output terminal of the signal 'signal1'. Second terminals of the transmission gates 61 and 62 are connected to an input terminal of the inverter circuit INV15. An output terminal of the inverter circuit INV15 is connected to an input terminal of the inverter circuit INV16, whose output terminal is connected to an output terminal of the signal 'signal0'. The input terminal for receiving the first switching signal SWS1 is connected to an inverting control terminal of the transmission gate 61 and a control terminal of the transmission gate 62. The input terminal for receiving the second switching signal SWS2 is connected to a control terminal of the transmission gate 61 and an inverting control terminal of the transmission gate 62.

When the overcurrent detection circuit 160 is not in an overcurrent detecting state, the first switching signal SWS1 and the second switching signal SWS2 received from the gated latch circuit 50 are at L level and H level, respectively. At this time, in the overcurrent mode switching circuit 60, the transmission gate 61 becomes conductive while the transmission gate 62 becomes non-conductive. Therefore, the signal 'signal' generated at the time of an input of the input signal IN passes through the transmission gate 61 and the inverter circuits INV15 and INV16 to be then output as the signal 'signal0' being in the same phase as that of the signal 'signal'. At this time, the signal 'signal' also passes through the inverter circuit INV14 to be then output as the signal 'signal1' being in an antiphase to the signal 'signal'.

On the other hand, when the overcurrent detection circuit 160 is in an overcurrent detecting state, the first switching signal SWS1 and the second switching signal SWS2 received from the gated latch circuit 50 are at H level and L level, respectively. Therefore, the transmission gate 61 becomes non-conductive while the transmission gate 62 becomes conductive. In this case, the signal 'signal' generated in response to an input of the input signal IN and received from the oscillation signal generation circuit 30 is inverted to be signals which are then output as the signals 'signal0' and 'signal1'.

The timing determination circuit 70 includes, as illustrated in FIG. 5, T flip-flops TFF11, TFF12, and TFF13, NOR circuits NOR11 and NOR12, NAND circuits NAND16 and NAND17, and an inverter circuit INV17. An input terminal for receiving the signal 'signal0' is connected to an input terminal of the T flip-flop TFF11, and an input terminal for receiving the signal 'signal1' is connected to a first input terminal of the NOR circuit NOR11. An input terminal for receiving the first overcurrent detection signal OCDS1 is connected to a first input terminal of the NAND circuit NAND17. An output terminal of the T flip-flop TFF11 is connected to an input terminal of the T flip-flop TFF12 and a second input terminal of the NOR circuit NOR11. An output terminal of the T flip-flop TFF12 is connected to an input terminal of the T flip-flop TFF13 and a first input terminal of the NOR circuit NOR12. An output terminal of the T flip-flop TFF13 is connected to a second input terminal of the NOR circuit NOR12. An output terminal of the NOR circuit NOR11 is connected to a first input terminal of the NAND circuit NAND16, and an output terminal of the NOR circuit NOR12 is connected to a second input terminal of the NAND circuit NAND16. An output terminal of the NAND circuit NAND16 is connected to a second input terminal of the NAND circuit NAND17, and an output terminal of the NAND circuit NAND17 is connected to an input terminal of the inverter circuit INV17. An output terminal of the inverter circuit INV17 serves as an output terminal of the timing determination circuit 70. Note that the NOR circuits NOR11 and NOR12 and the NAND circuit NAND16 form a first logical operation circuit, and the NAND circuit NAND17 and the inverter circuit INV17 form a second logical operation circuit.

Upon receiving the signal 'signal0' from the overcurrent mode switching circuit 60, the timing determination circuit 70 sequentially frequency divides the signal 'signal0' using a down counter circuit made up of the three stage T flip-flops TFF11, TFF12, and TFF13. That is, the T flip-flop TFF11 outputs the signal 'signal2' having a doubled frequency of the signal 'signal0', the T flip-flop TFF12 outputs the signal 'signal3' having a doubled frequency of the signal 'signal2', and the T flip-flop TFF3 outputs the signal 'signal4' having a doubled frequency of the signal 'signal3'. Upon reception of the signals 'signal1' and 'signal2', the NOR circuit NOR11 outputs a signal of H level when both received signals are at L level. Upon reception of the signals 'signal3' and 'signal4', the NOR circuit NOR12 outputs a signal of H level when both received signals are at L level. The NAND circuit NAND16 outputs an L-level signal (a match signal) only when receiving H-level signals from both NOR circuits NOR11 and NOR12. The L-level signal output from the NAND circuit NAND16 is used to periodically turn on the main MOSFET 110 for only a brief period of time.

Note however that the signal 'signal1' remains at H level just after the input signal IN of H level is input when the overcurrent detection circuit 160 has detected no overcurrent situation, and the NAND circuit NAND16 therefore outputs a signal of H level. As a result, although the input signal IN of H level has been input, the NAND circuit NAND16 is not able to output a signal of L level to turn on the main MOSFET 110.

To deal with this problem, the timing determination circuit 70 is configured to include the NAND circuit NAND17 and the inverter circuit INV17 to output a signal of L level to turn on the main MOSFET 110 in synchronization with the input signal IN when the overcurrent detection circuit 160 has detected no overcurrent situation. That is, the output signal of the NAND circuit NAND16 and the first overcurrent detection signal OCDS1 are input to the NAND circuit NAND17. During receiving the first overcurrent detection signal OCDS1 of L level, which indicates no detection of an overcurrent situation, the NAND circuit NAND17 outputs a signal of H level irrespective of the logic level of the output signal of the NAND circuit NAND16, and the inverter circuit INV17 therefore outputs the signal 'output' of L level. That is, the NAND circuit NAND17 is enabled in response to the match signal output from the NAND circuit NAND16 or the first overcurrent detection signal OCDS1 being at L level, and the main MOSFET 110 is turned on only for an output enabled period.

Figure 6:
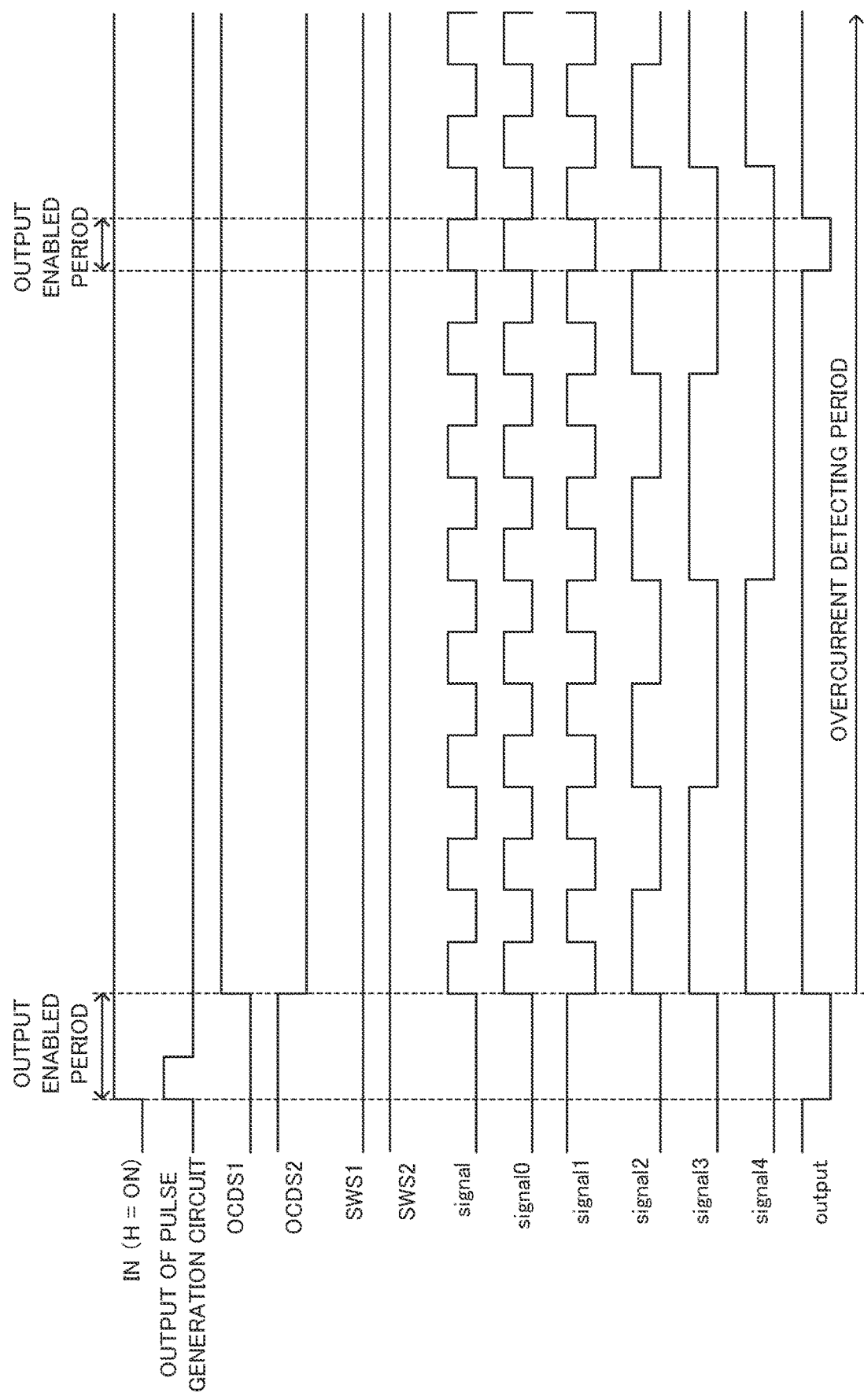
FIG. 6 is a timing diagram illustrating operation of the logic circuit performed when an overcurrent situation is detected after an input of an input signal.
Figure 8:
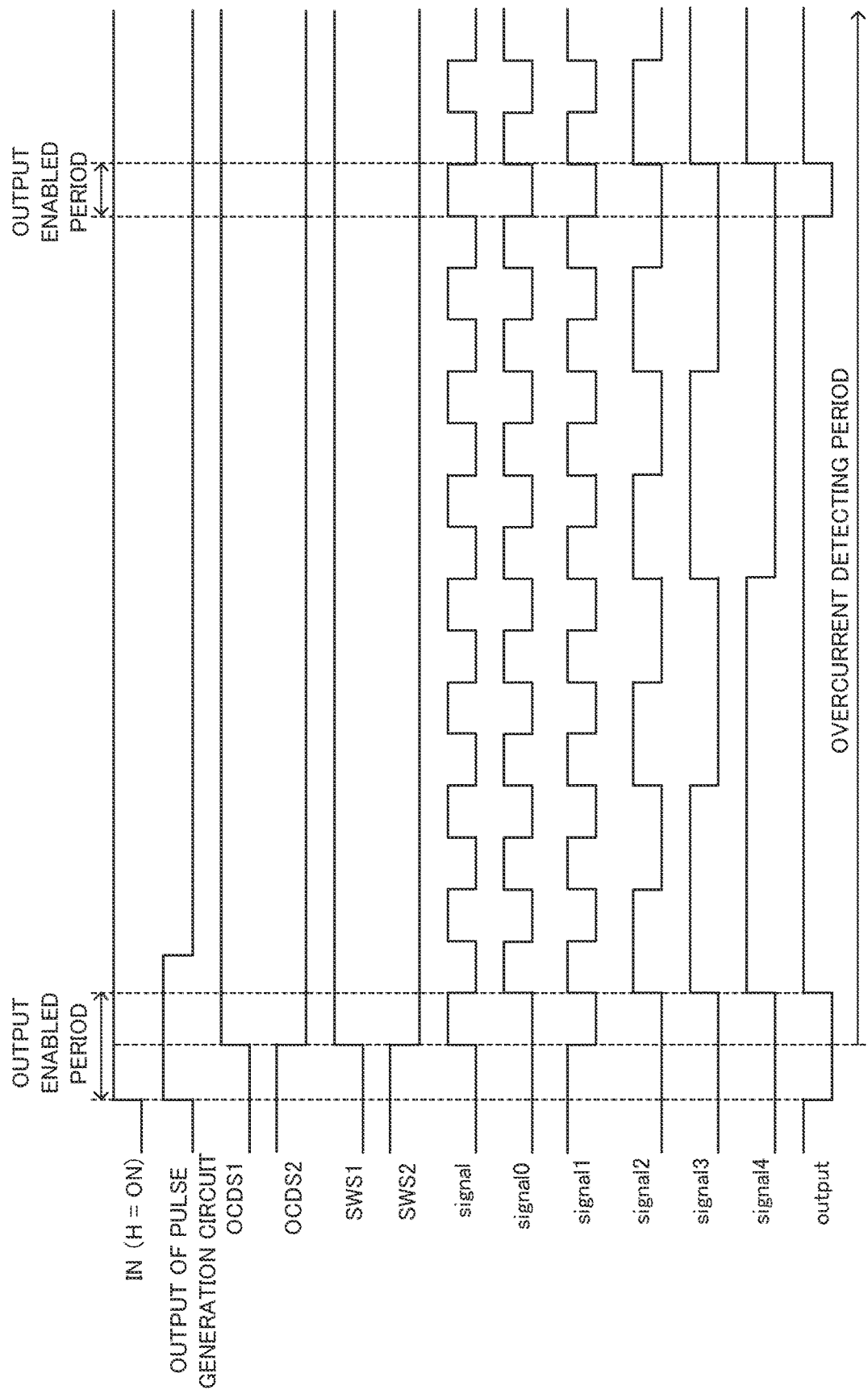
FIG. 8 is a timing diagram illustrating operation of the logic circuit performed when an overcurrent situation is detected during a pulse generation circuit outputting a pulse.

Next described is the operation of the logic circuit 10 with reference to FIGS. 6 and 8.

Figure 7:
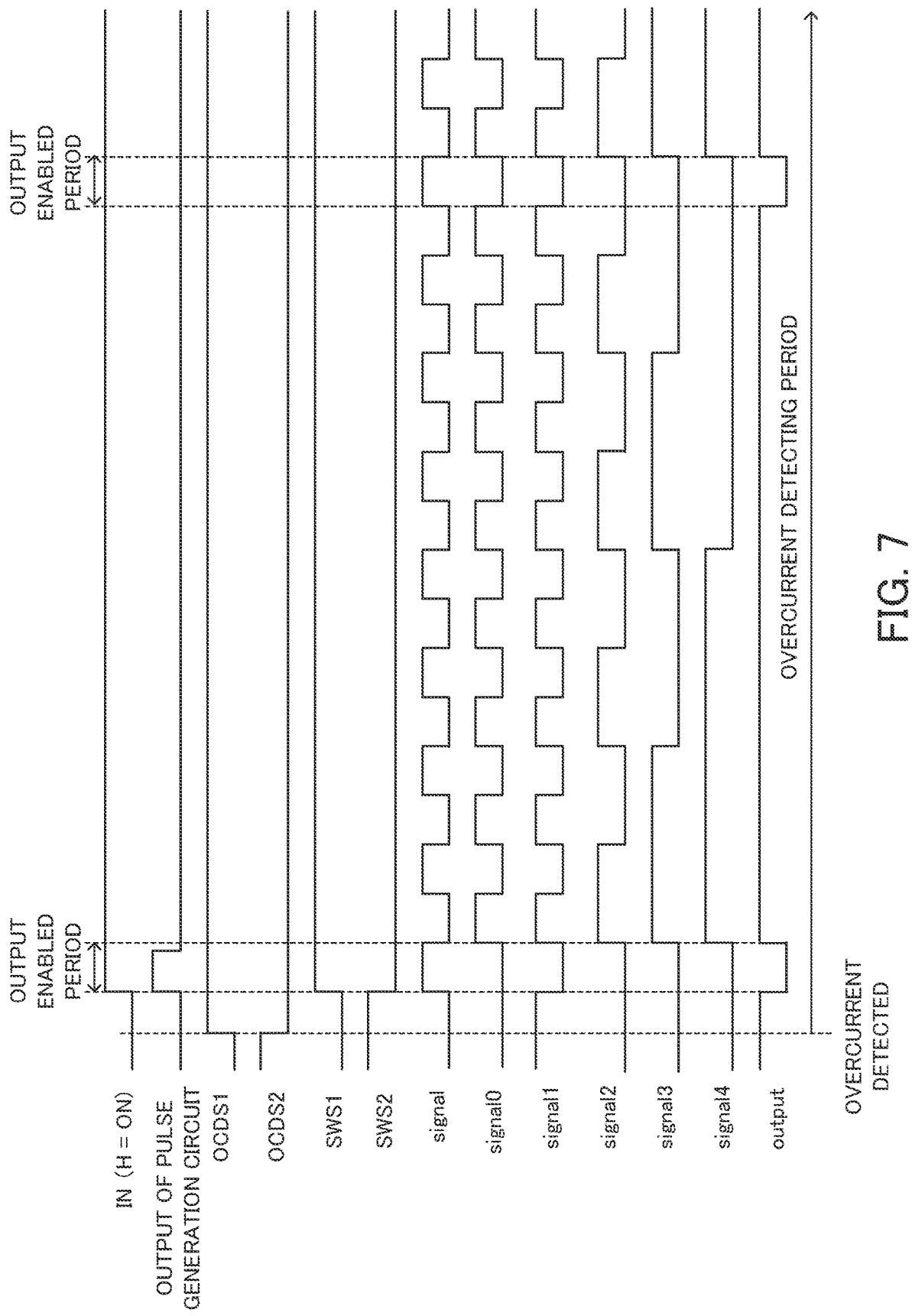
FIG. 7 is a timing diagram illustrating operation of the logic circuit performed when an overcurrent situation is detected before the input of the input signal.

FIG. 6 is a timing diagram illustrating operation of the logic circuit performed when an overcurrent situation is detected after an input of the input signal. FIG. 7 is a timing diagram illustrating operation of the logic circuit performed when an overcurrent situation is detected before an input of the input signal. FIG. 8 is a timing diagram illustrating operation of the logic circuit performed when an overcurrent situation is detected during a pulse generation circuit outputting a pulse. Note that FIGS. 6 to 8 depict, from the top to the bottom, the input signal IN; an output of the pulse generation circuit; the first overcurrent detection signal OCDS1; the second overcurrent detection signal OCDS2; the first switching signal SWS1; the second switching signal SWS2; the signal 'signal'; the signal 'signal0'; the signal 'signal1'; the signal 'signal2'; the signal 'signal3'; the signal 'signal4'; and the signal 'output'.

First described is the operation of the logic circuit 10 performed when an overcurrent situation is detected after an input of the input signal, with reference to FIG. 6. Upon an input of the input signal IN of H level, the pulse generation circuit 40 generates a pulse that rises in synchronization with the rise of the input signal IN, as illustrated in FIG. 6. At this time, because having detected no overcurrent situation, the overcurrent detection circuit 160 outputs the first overcurrent detection signal OCDS1 of L level and the second overcurrent detection signal OCDS2 of H level.

Upon receiving the pulse from the pulse generation circuit 40, the gated latch circuit 50 latches the first overcurrent detection signal OCDS1 and the second overcurrent detection signal OCDS2. The gated latch circuit 50 outputs L level of the latched first overcurrent detection signal OCDS1 as the first switching signal SWS1 and H level of the latched second overcurrent detection signal OCDS2 as the second switching signal SWS2.

In the overcurrent mode switching circuit 60, the first switching signal SWS1 and the second switching signal SWS2 cause the transmission gates 61 and 62 to become conductive and non-conductive, respectively.

Subsequently, in response to the overcurrent detection circuit 160 detecting an overcurrent situation, the first overcurrent detection signal OCDS1 rises to H level and the second overcurrent detection OCDS2 falls to L level. However, at this time, the generation of the pulse has already ended, and the gated latch circuit 50 has been disabled. As a result, the logic state held by the gated latch circuit 50 remains unchanged, and therefore the logic levels of the first switching signal SWS1 and the second switching signal SWS2 also remain unchanged.

In response to the overcurrent detection circuit 160 detecting an overcurrent situation, the oscillation signal generation circuit 30 outputs the signal 'signal' that rises in synchronization with the rise of the first overcurrent detection signal OCDS1. At this time, the overcurrent mode switching circuit 60 does not make overcurrent mode switching, and the signal 'signal' therefore passes through the transmission gate 61 and the inverter circuits INV15 and INV16 to be then output as the signal 'signal0' being in the same phase as that of the signal 'signal'. The signal 'signal' also passes through the inverter circuit INV14 to be then output as the signal 'signal1' being in an antiphase to the signal 'signal'.

In the timing determination circuit 70, upon reception of the signal 'signal0' of H level and the signal 'signal1', the NAND circuit NAND16 outputs a signal of H level. At this time, because the first overcurrent detection signal OCDS1 is at H level, the NAND circuit NAND17 outputs a signal of L level and the inverter circuit INV17 therefore outputs the signal 'output' of H level.

Subsequently, upon reception of the signal 'signal0', the signals 'signal2', 'signal3' and 'signal4' are sequentially generated in the timing determination circuit 70. Each time a match signal is output from the NAND circuit NAND16, the output of the NAND circuit NAND16 falls to L level, which rises the output of the NAND circuit NAND17 to H level. As a result, the inverter circuit INV17 outputs the signal 'output' of L level. The signal 'output' turns on the main MOSFET 110 only for an output enabled period during which the signal 'output' remains at L level.

Thus, if an overcurrent situation is detected during the input signal IN being input, the output enabled period of the signal 'output' is terminated right away. This provides safe protection of the main MOSFET 110 from overheating due to overcurrent.

Next described is the operation of the logic circuit performed when an overcurrent situation is detected before an input of the input signal, with reference to FIG. 7. When detecting an overcurrent situation before the input signal IN is input (i.e., at L level), the overcurrent detection circuit 160 outputs the first overcurrent detection signal OCDS1 of H level and the second overcurrent detection signal OCDS2 of L level.

Subsequently, upon an input of the input signal IN of H level, the pulse generation circuit 40 generates a pulse that rises in synchronization with the rise of the input signal IN and supplies it to the gated latch circuit 50.

Upon reception of the pulse from the pulse generation circuit 40, the gated latch circuit 50 latches the first overcurrent detection signal OCDS1 and the second overcurrent detection signal OCDS2. The gated latch circuit 50 outputs H level of the latched first overcurrent detection signal OCDS1 as the first switching signal SWS1 and L level of the latched second overcurrent detection signal OCDS2 as the second switching signal SWS2.

In the overcurrent mode switching circuit 60, the first switching signal SWS1 and the second switching signal SWS2 cause the transmission gates 61 and 62 to become non-conductive and conductive, respectively. As a result, the signal 'signal' generated in synchronization with the rise of the input signal IN passes through the inverter circuit INV14, the transmission gate 62, and the inverter circuits INV15 and INV16 to be then output as the signal 'signal0'. The signal 'signal' also passes through the inverter circuit INV14 to be then output as the signal 'signal1'. These signals 'signal0' and 'signal1' are in an antiphase to the signal 'signal'.

In the timing determination circuit 70, because the signals 'signal1', 'signal2', 'signal3', and 'signal4' are at L level upon reception of the signal 'signal0', the NAND circuit NAND16 outputs a L-level, i.e., match signal. Therefore, the NAND circuit NAND17 outputs a signal of H level, and the inverter circuit INV17 then outputs the signal 'output' of L level to turn on the main MOSFET 110 only for the output enabled period.

Subsequently, the down counter circuit sequentially generates the signals 'signal2', 'signal3', and 'signal4' with a delay of half a cycle after the rise of the signal 'signal'. Each time the NAND circuit NAND16 outputs a match signal being at L level, the main MOSFET 110 is turned on.

Thus, when the input signal IN is input while an overcurrent situation has been detected, the start of the counting process of the counter circuit to generate the signal 'output' is delayed by half a cycle of the signal 'signal'. This ensures establishment of the output enabled period of the signal 'output' for half a cycle of the signal 'signal' after the input of the input signal IN, which in turn allows the microcomputer 200 to have sufficient time to receive the signal AMP when an overcurrent situation has been detected.

Note that the output enabled period upon the input of the input signal IN, that is, the period of half a cycle of the signal 'signal' output from the oscillation signal generation circuit 30 is preferably more than or equal to the period during which the pulse generation circuit 40 is outputting a pulse. This ensures that the logic circuit 10 outputs a signal to turn on the main MOSFET 110 at least during the period when the pulse generation circuit 40 outputs a pulse, regardless of whether an overcurrent situation has been detected at the time of the input of the input signal IN.

Next described is the operation of the logic circuit performed when an overcurrent situation is detected during a pulse generation circuit outputting a pulse, with reference to FIG. 8. Upon an input of the input signal IN of H level, the pulse generation circuit 40 outputs a pulse. At this time, because having detected no overcurrent situation, the overcurrent detection circuit 160 outputs the first overcurrent detection signal OCDS1 of L level. Hence, in the timing determination circuit 70, the NAND circuit NAND17 receives the first overcurrent detection signal OCDS1 of L level and therefore outputs a signal of H level, and in turn the inverter circuit INV17 outputs the signal 'output' of L level.

If the overcurrent detection circuit 160 detects an overcurrent situation during the pulse generation circuit 40 outputting a pulse, the first overcurrent detection signal OCDS1 in the overcurrent detection circuit 160 rises to H level while the second overcurrent detection signal OCDS2 falls to L level.

At this time, the gated latch circuit 50 latches the first overcurrent detection signal OCDS1 and the second overcurrent detection signal OCDS2 whose logic levels have been changed because it is still receiving the pulse from the pulse generation circuit 40. The gated latch circuit 50 outputs H level of the latched first overcurrent detection signal OCDS1 as the first switching signal SWS1 and L level of the latched second overcurrent detection signal OCDS2 as the second switching signal SWS2.

In the overcurrent mode switching circuit 60, the first switching signal SWS1 and the second switching signal SWS2 cause the transmission gates 61 and 62 to become non-conductive and conductive, respectively. As a result, the signal 'signal' generated in synchronization with the rise of the first overcurrent detection signal OCDS1 passes through the inverter circuit INV14, the transmission gate 62, and the inverter circuits INV15 and INV16 to be then output as the signal 'signal0'. The signal 'signal' also passes through the inverter circuit INV14 to be then output as the signal 'signal1'. These signals 'signal0' and 'signal1' are in an antiphase to the signal 'signal'.

In the timing determination circuit 70, the first overcurrent detection signal OCDS1 is at L level right after the input signal IN of H level is input, and therefore the NAND circuit NAND17 outputs a signal of H level and the inverter circuit INV17 then outputs the signal 'output' of L level. Right after the first overcurrent detection signal OCDS1 rises to H level in response to the overcurrent detection circuit 160 detecting an overcurrent situation, the signal 'signal' output from the oscillation signal generation circuit 30 rises to H level. This causes all the signals 'signal0', 'signal1', 'signal2', 'signal3', and 'signal4' to fall to L level. Therefore, the NAND circuit NAND16 outputs a L-level, i.e., match signal, and the NAND circuit NAND17 then outputs a signal of H level. As a result, the inverter circuit INV17 remains outputting the signal 'output' of L level.

Subsequently, when the output enabled period has ended with a delay of half a cycle after the signal 'signal', the down counter circuit sequentially generates the signals 'signal2', 'signal3', and 'signal4'. Each time the NAND circuit NAND16 outputs a match signal being at L level, the output enabled period becomes effective so as to turn on the main MOSFET 110.

Thus, in the timing determination circuit 70, upon the overcurrent detection circuit 160 detecting an overcurrent situation, the counter circuit starts counting with a delay of half a cycle of the signal 'signal' after the overcurrent detection. The output enabled period is extended until the counting starts, which allows the microcomputer 200 to have sufficient time to receive the signal AMP when an overcurrent situation has been detected.

Note that, in FIGS. 6 to 8, the signal 'output' is set to H level when the input signal IN is at L level. This is because the signal 'output' is configured to be set to H level by a circuit not illustrated when the input signal IN is at L level.

According to the preferred embodiment described above, the oscillation signal generation circuit 30 generates the signal 'signal' that rises in response to both the input signal IN and the first overcurrent detection signal OCDS1 being at H level; however, the applicable scope of the technology according to the preferred embodiment is not limited to this example. For example, the signal 'signal' may be configured to start from L level when both the input signal IN and the first overcurrent detection signal OCDS1 are at H level. Then, in the overcurrent mode switching circuit 60, the input positions of the first switching signal SWS1 and the second switching signal SWS2 depicted in FIG. 4 may be swapped. As for the timing determination circuit 70, the counter circuit is made up of the three stage T flip-flops TFF11, TFF12, and TFF13; however, the number of stages of the T flip-flops is not limited to this example. As for the pulse generation circuit 40, a resistor or diode-connected MOSFET may be used in place of the MOSFET 42. In addition, the pulse generation circuit 40 may be configured using a NOR circuit in place of the NAND circuit. Similarly, the gated latch circuit 50 may be configured using NOR circuits in place of the NAND circuits.

According to the semiconductor device of the above-described embodiment, the power semiconductor element is turned off immediately upon detection of an overcurrent situation during the power semiconductor element being ON. This prevents the power semiconductor element from being overheated. In addition, when an overcurrent situation is detected at least during the period when the pulse generation circuit is outputting a pulse, a turn on signal is output to the power semiconductor element for a predetermined period of time. This allows sufficient time to be provided to inform a superior control unit of the detection of an overcurrent situation, which in turn prevents notification errors.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a power semiconductor element;
an overcurrent detection circuit configured to detect an overcurrent situation; and
a logic circuit configured to output a first output signal that turns off the power semiconductor element after the overcurrent detection circuit detects the overcurrent situation, wherein:
the logic circuit includes a pulse generation circuit configured to output a pulse upon receiving an input signal that turns on the power semiconductor element, and
the logic circuit outputs, upon detection of the overcurrent situation by the overcurrent detection circuit while the pulse is being output, a second output signal that turns on the power semiconductor element for a predetermined period of time after the detection of the overcurrent situation.

2. The semiconductor device according to claim 1, wherein:
the pulse generated by the pulse generation circuit persists only for predetermined period of time upon the input of the input signal.

3. A semiconductor device, comprising:
a power semiconductor element;
an overcurrent detection circuit configured to detect an overcurrent situation; and
a logic circuit configured to output a first output signal that turns off the power semiconductor element after the overcurrent detection circuit detects the overcurrent situation, wherein:
the logic circuit includes a pulse generation circuit configured to generate and output a pulse upon receiving an input signal that turns on the power semiconductor element, and
when the overcurrent detection circuit has been detecting the overcurrent situation since before the logic circuit generates the pulse, the logic circuit outputs a second output signal that turns on the power semiconductor element for a predetermined period of time upon the pulse being output.

4. The semiconductor device according to claim 3, wherein:
the logic circuit outputs the second output signal that turns on the power semiconductor element at least during a period while the pulse generation circuit outputs the pulse irrespective of whether or not the overcurrent detection circuit has detected the overcurrent situation.

5. A semiconductor device, comprising:
a power semiconductor element;
an overcurrent detection circuit; and
a logic circuit configured to periodically turn on the power semiconductor element for only a prescribed period of time after the overcurrent detection circuit has detected an overcurrent situation, wherein:
the logic circuit includes:
an oscillation signal generation circuit configured to generate an oscillation signal upon simultaneously receiving an input signal that turns on the power semiconductor element and an overcurrent detection signal output from the overcurrent detection circuit upon detection of the overcurrent situation,
a pulse generation circuit configured to generate a pulse upon receiving the input signal,
a gated latch circuit configured to hold an overcurrent detection state of the overcurrent detection circuit upon receiving the pulse,
an overcurrent mode switching circuit configured to receive the oscillation signal, and output a first output signal and a second output signal, the first output signal being either the oscillation signal or an inverted oscillation signal, according to the overcurrent detection state held by the gated latch circuit, and the second output signal being the inverted oscillation signal, and
a timing determination circuit configured to frequency divide the first output signal into a plurality of frequency divided signals and output an output control signal to periodically turn on the power semiconductor element based on the second output signal and the plurality of frequency divided signals.

6. The semiconductor device according to claim 5, wherein:
the gated latch circuit
includes a gate circuit configured to import the overcurrent detection state of the overcurrent detection circuit upon receiving the pulse, and a latch circuit configured to hold the imported overcurrent detection state, and
outputs a switching signal to cause the overcurrent mode switching circuit to invert or not to invert the oscillation signal according to the overcurrent detection state held by the latch circuit.

7. The semiconductor device according to claim 6, wherein:
the overcurrent mode switching circuit includes:
an inverter circuit configured to output the inverted oscillation signal, and
a switch circuit configured to select the counter input signal from among the oscillation signal and the inverted oscillation signal based on the switching signal output from the gated latch circuit.

8. The semiconductor device according to claim 7, wherein:
the switch circuit is a transmission gate.

9. The semiconductor device according to claim 5, wherein:
the timing determination circuit includes:
a counter circuit configured to frequency divide the first output signal, and
a logical operation circuit configured to output the output control signal in response to complete agreement of logical states of the second output signal and the plurality of frequency divided signals.

10. The semiconductor device according to claim 9, wherein:
the counter circuit is a plurality of stages of T flip-flops.

11. The semiconductor device according to claim 5, wherein:
the timing determination circuit includes:
a counter circuit configured to frequency divide the first output signal,
a first logical operation circuit configured to output a match signal in response to complete agreement of logical states of the second output signal and the plurality of frequency divided signals, and
a second logical operation circuit configured to receive the overcurrent detection signal and the match signal, and output, in response to the overcurrent detection circuit having detected no overcurrent situation upon receiving the input signal, the output control signal in synchronization with the input signal.

\* \* \* \* \*